(12) United States Patent
Uchida et al.

(10) Patent No.: US 12,414,465 B2
(45) Date of Patent: Sep. 9, 2025

(54) THERMOELECTRIC CONVERSION MODULE

(71) Applicants: ZEON CORPORATION, Tokyo (JP); Tokyo University of Science Foundation, Tokyo (JP)

(72) Inventors: Hideki Uchida, Tokyo (JP); Takashi Nakajima, Tokyo (JP); Masahiro Motosuke, Tokyo (JP); Takahiro Yamamoto, Tokyo (JP)

(73) Assignees: ZEON CORPORATION, Tokyo (JP); Tokyo University of Science Foundation, Tokyo (JP)

( * ) Notice: Subject to any disclaimer, the term of this patent is extended or adjusted under 35 U.S.C. 154(b) by 246 days.

(21) Appl. No.: 18/550,680

(22) PCT Filed: Mar. 30, 2022

(86) PCT No.: PCT/JP2022/016309
§ 371 (c)(1),
(2) Date: Sep. 15, 2023

(87) PCT Pub. No.: WO2022/210982
PCT Pub. Date: Oct. 6, 2022

(65) Prior Publication Data
US 2024/0164212 A1    May 16, 2024

(30) Foreign Application Priority Data
Mar. 31, 2021 (JP) ................. 2021-062105

(51) Int. Cl.
*H10N 10/17* (2023.01)
(52) U.S. Cl.
CPC ................... *H10N 10/17* (2023.02)
(58) Field of Classification Search
CPC ......... H10N 10/00; H10N 10/17; H10N 10/80
See application file for complete search history.

(56) References Cited

U.S. PATENT DOCUMENTS

| | | | |
|---|---|---|---|
| 7,854,991 B2 | 12/2010 | Hata et al. | |
| 2011/0220162 A1* | 9/2011 | Siivola | H10N 10/17 136/203 |
| 2016/0163949 A1* | 6/2016 | Stark | H10N 10/817 438/54 |

FOREIGN PATENT DOCUMENTS

| | | | |
|---|---|---|---|
| JP | 2005328000 A | * | 11/2005 |
| JP | 3981783 B2 | | 9/2007 |
| WO | 2006011655 A1 | | 2/2006 |

OTHER PUBLICATIONS

Machine translation of JP-2005328000-A, Sugiyama Susumu. (Year: 2005).*

(Continued)

*Primary Examiner* — Mayla Gonzalez Ramos
(74) *Attorney, Agent, or Firm* — KENJA IP LAW PC

(57) ABSTRACT

It would be helpful to provide a sheet-form thermoelectric conversion module with excellent thermoelectric conversion characteristics. A thermoelectric conversion module according to the disclosure is a thermoelectric conversion module formed in sheet form, the thermoelectric conversion module being disposed in contact or proximity to a heat source and generating power based on a temperature difference between a portion close to the heat source and a portion away from the heat source, the thermoelectric conversion module including an incision penetrating in a sheet thickness direction, wherein by stretching the thermoelectric conversion module in a predetermined direction, mutually opposite edges of the incision are separated, and the thermoelectric conversion module is transformed from a sheet form A into a three-dimensional structural form B protruding in the sheet thickness direction.

20 Claims, 29 Drawing Sheets

(56) References Cited

OTHER PUBLICATIONS

Oct. 3, 2023, International Preliminary Report on Patentability issued in the International Patent Application No. PCT/JP2022/016309.

* cited by examiner

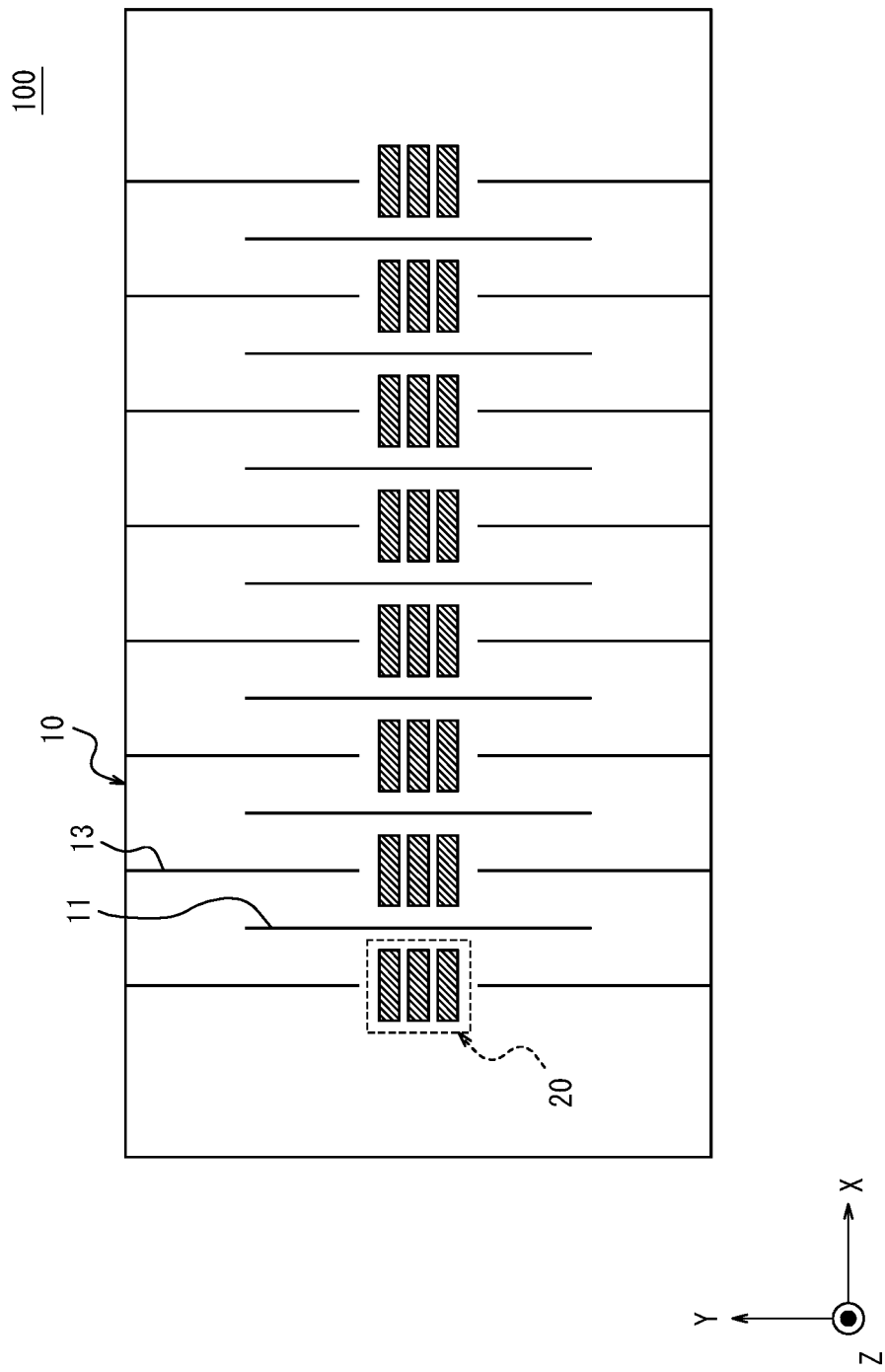

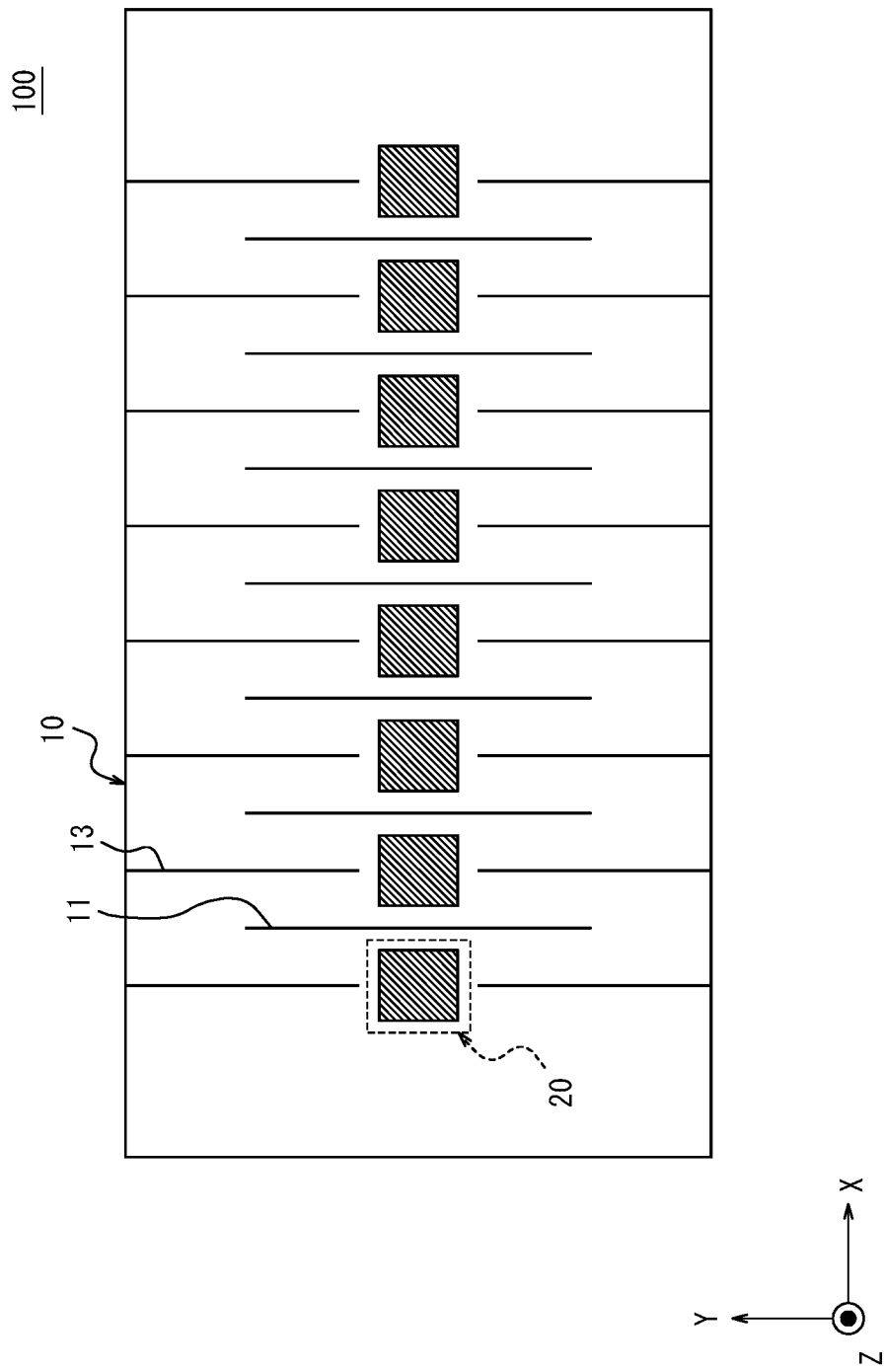

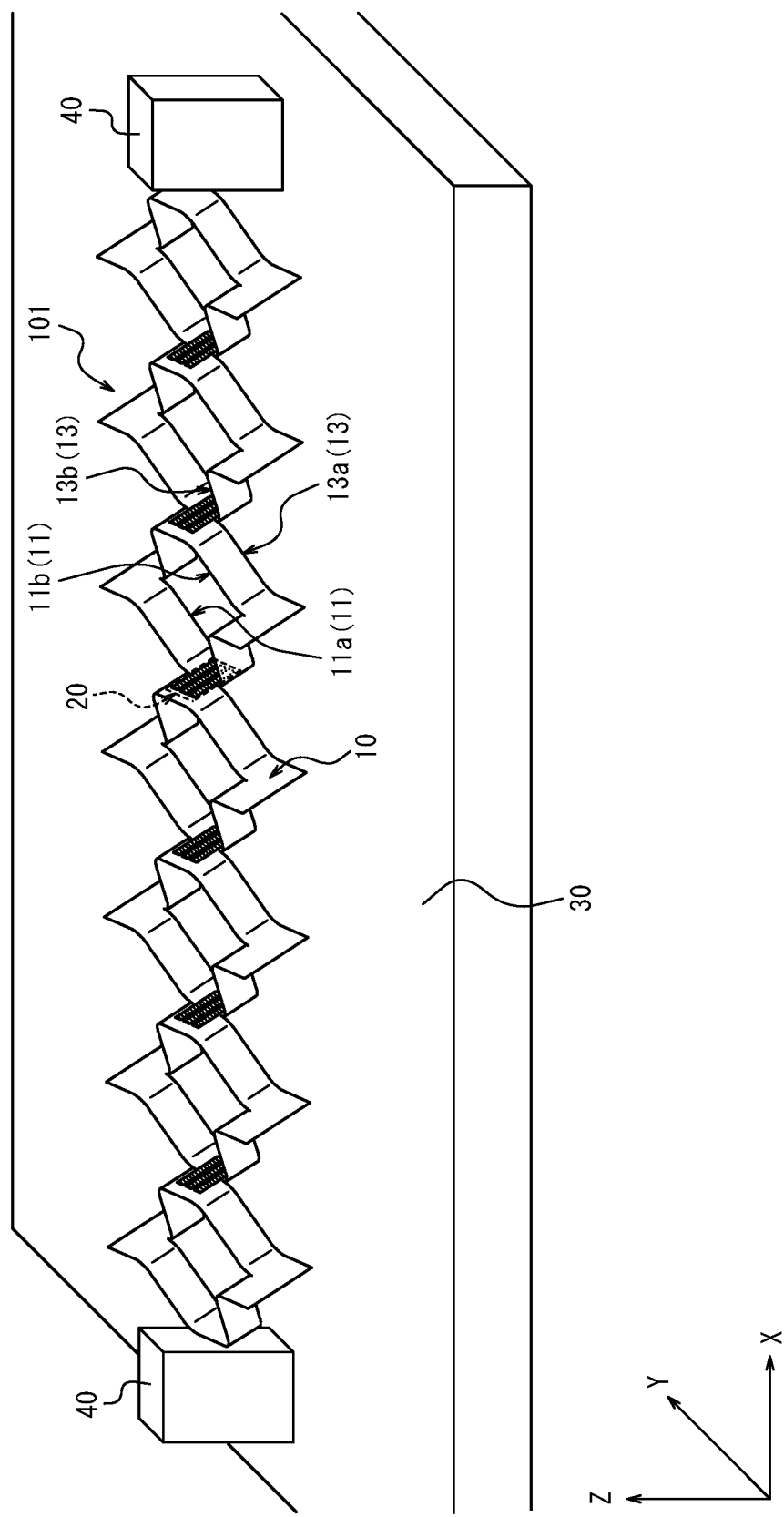

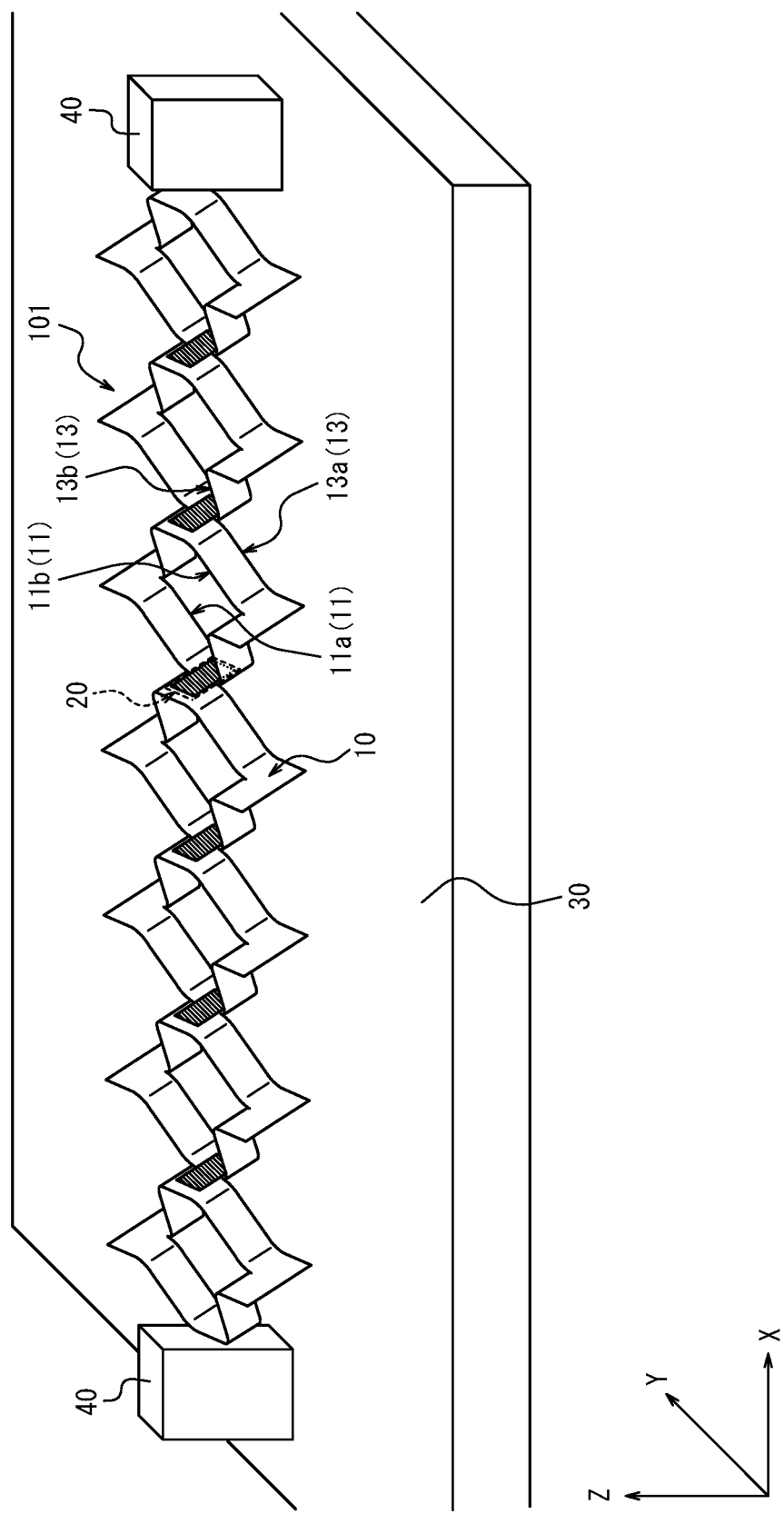

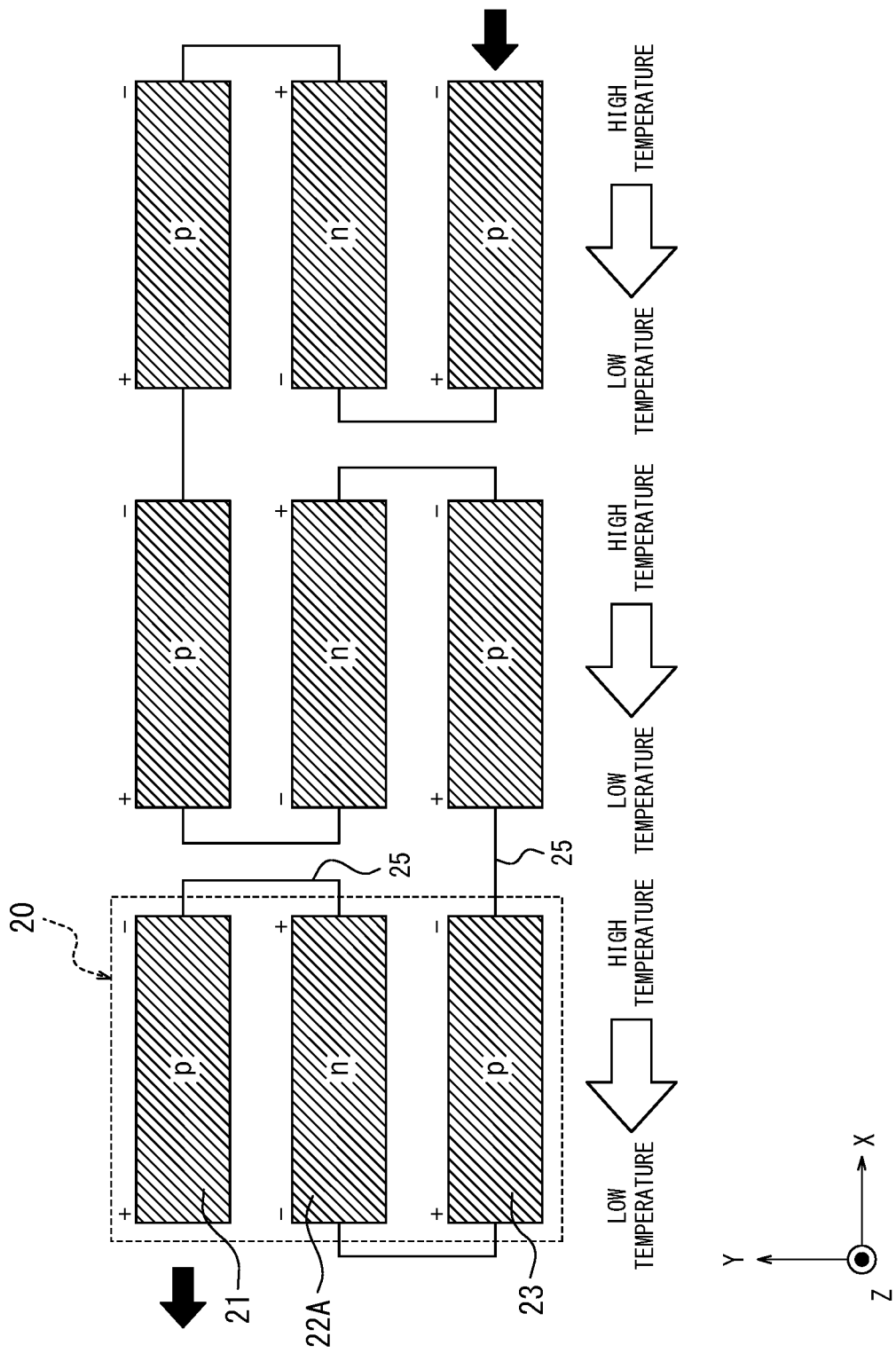

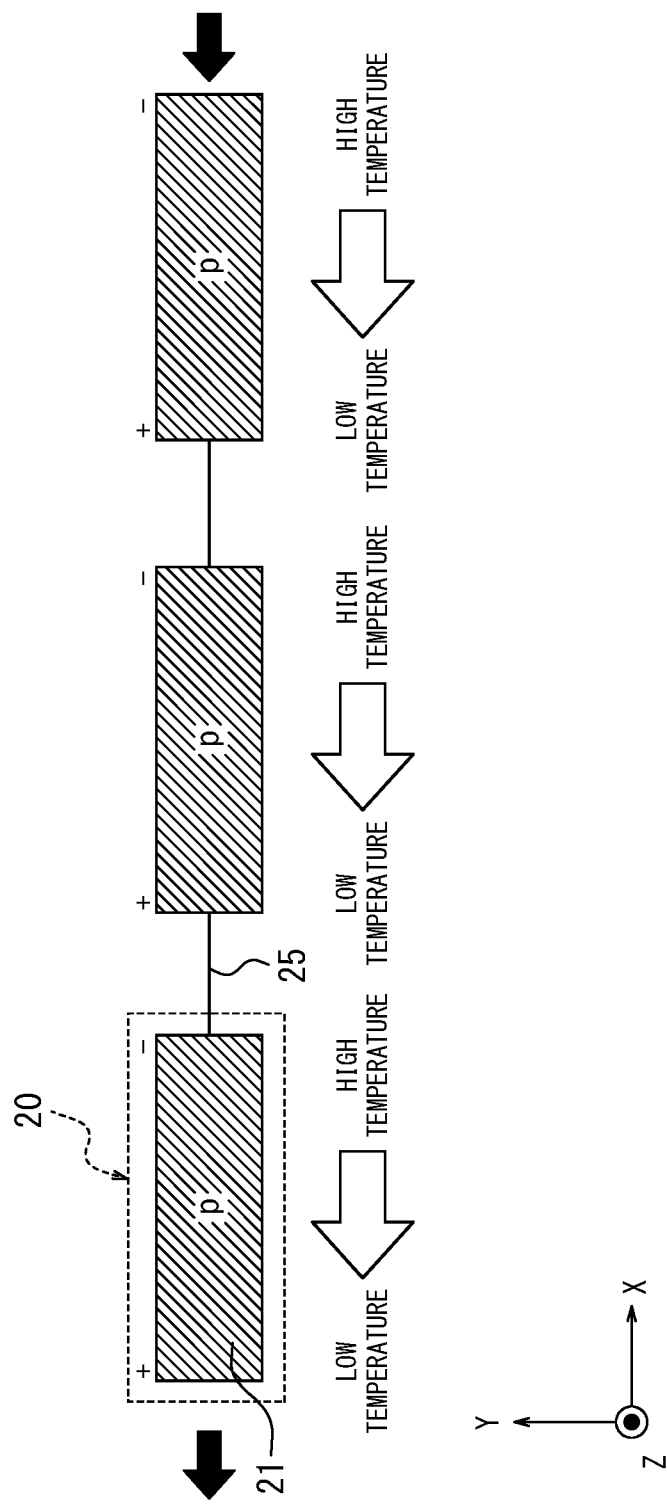

THERMOELECTRIC CONVERSION MODULE

CROSS-REFERENCE TO RELATED APPLICATION

This application claims priority to Japanese Patent Application No. 2021-62105, filed on Mar. 31, 2021, the entire contents of which are incorporated herein by reference.

TECHNICAL FIELD

This disclosure relates to a thermoelectric conversion module.

BACKGROUND

In recent years, flexible, thin, and lightweight sheet-form thermoelectric conversion modules using sheet-form thermoelectric conversion elements have been proposed. For example, Patent Literature (PTL) 1 discloses a thermoelectric conversion element in which flexible film-like substrates each made of materials with different heat conductivities are provided on both sides of the thermoelectric conversion module, and a material with a higher heat conductivity is located on a portion of an outer surface of each of the substrates.

CITATION LIST

Patent Literature

PTL 1: Japanese Patent No. 3981738

SUMMARY

Technical Problem

However, in PTL 1, a temperature gradient in a thickness direction of a substrate is converted into a temperature gradient in an in-plane direction of the substrate, so it is difficult to obtain the temperature difference necessary for power generation unless the area of the thermoelectric conversion element is enlarged. In addition, it is difficult to respond flexibly to heat sources with various shapes and directions of temperature difference, and there is room for improvement in these respects.

It would be helpful to provide a sheet-form thermoelectric conversion module with excellent thermoelectric conversion characteristics.

Solution to Problem

This disclosure aims at advantageously solving the above problem and a thermoelectric conversion module according to the disclosure is a thermoelectric conversion module formed in sheet form, the thermoelectric conversion module being disposed in contact or proximity to a heat source and generating power based on a temperature difference between a portion close to the heat source and a portion away from the heat source, the thermoelectric conversion module including an incision penetrating in a sheet thickness direction, wherein by stretching the thermoelectric conversion module in a predetermined direction, mutually opposite edges of the incision are separated, and the thermoelectric conversion module is transformed from a sheet form A into a three-dimensional structural form B protruding in the sheet thickness direction. By adopting such a configuration, the thermoelectric conversion module in sheet form can be transformed into the three-dimensional structural form and brought close to the heat source by the simple method of stretching the thermoelectric conversion module in the predetermined direction, thereby increasing the temperature difference within the thermoelectric conversion module in sheet form and improving thermoelectric conversion characteristics.

The thermoelectric conversion module according to the disclosure preferably includes a sheet-form substrate, and an element main body formed on the substrate. By adopting such a configuration, only a portion of the thermoelectric conversion module that protrudes in the sheet thickness direction can be formed with a thermoelectric conversion element, so the thermoelectric conversion characteristics can be improved using less thermoelectric conversion material.

In the thermoelectric conversion module according to the disclosure, the element main body preferably includes an element body formed in a strip shape, and the element body is preferably disposed so that, in a state of the form B, both longitudinal ends of the element body are away from each other in a sheet protrusion direction. By adopting such a configuration, the temperature difference of the element body in the longitudinal direction can be efficiently created by bringing a back surface of the sheet closer to the heat source, thereby improving the thermoelectric conversion characteristics.

In the thermoelectric conversion module according to the disclosure, the element main body preferably includes a plurality of element bodies formed in a strip shape, and the plurality of element bodies adjacent to each other is preferably electrically connected in series at longitudinal ends. By adopting such a configuration, thermoelectromotive force generated in the element bodies can be increased by series connection and output.

In the thermoelectric conversion module according to the disclosure, the element body preferably contains carbon nanotubes. By adopting such a configuration, the thermoelectric conversion module can obtain the effect of increasing the Seebeck coefficient itself of the element body by stretching the thermoelectric conversion module, thereby improving the thermoelectric conversion characteristics. In addition, the mechanical strength of the thermoelectric conversion module can be further improved and its weight can be reduced.

In the thermoelectric conversion module according to the disclosure, the length of the element body in a longitudinal direction is preferably 30 mm or more. By adopting such a configuration, the temperature difference within the element body can be easily ensured, thus improving the thermoelectric conversion characteristics.

In the thermoelectric conversion module according to the disclosure, the length of the element body in a longitudinal direction is preferably 5 mm or more and 12 mm or less. By adopting such a configuration, electromotive force generated by the thermoelectric conversion module can be increased for the same amount of carbon nanotubes used.

In the thermoelectric conversion module according to the disclosure, the heat conductivity of the substrate is preferably 5.0 [W/(m·K)] or less. By adopting such a configuration, the heat conduction of the element body in the longitudinal direction can be suppressed, making it easier to ensure the temperature difference and improving the thermoelectric conversion characteristics.

In the thermoelectric conversion module according to the disclosure, the thermoelectric conversion module preferably includes, in a state of the form B, the element main body as a power generation portion, a heat absorption portion in contact or proximity to the heat source, and a heat dissipation portion in contact or proximity to a heat radiator with a lower temperature than the heat source, the heat dissipation portion being disposed on an opposite side to the heat absorption portion in a sheet protrusion direction. By adopting such a configuration, the temperature difference of the element body in the longitudinal direction can be increased, thus improving the thermoelectric conversion characteristics.

The thermoelectric conversion module according to the disclosure preferably includes a plurality of the incisions. By adopting such a configuration, the temperature differences of the plurality of element main bodies can be easily ensured, thus improving the thermoelectric conversion characteristics.

In the thermoelectric conversion module according to the disclosure, the predetermined direction is preferably a direction approximately orthogonal to an extension direction of the incision in the thermoelectric conversion module in a state of the form A. By adopting such a configuration, stretching the thermoelectric conversion module in the predetermined direction increases distortion around the incision and makes the thermoelectric conversion module protrude in the sheet thickness direction, thus effectively creating the temperature difference within the element main body.

In the thermoelectric conversion module according to the disclosure, the predetermined direction is preferably a direction approximately orthogonal to the extension direction of the incision in an in-plane direction of the thermoelectric conversion module in the state of the form A. By adopting such a configuration, stretching the thermoelectric conversion module in the predetermined direction increases distortion around the incision and makes the thermoelectric conversion module protrude in the sheet thickness direction, thus effectively creating the temperature difference within the element main body.

In the thermoelectric conversion module according to the disclosure, the incision preferably has a first incision that is disposed at an approximately center position in a direction orthogonal to the predetermined direction in an area between a plurality of the element main bodies arranged in the predetermined direction, and a second incision that extends from both sides of the element main body in the direction orthogonal to the predetermined direction to both ends of the thermoelectric conversion module, and the first and second incisions are preferably provided alternately in the predetermined direction. By adopting such a configuration, the separation of the edges of the first incision makes it easier to displace an end of the element main body in the predetermined direction to a direction perpendicular to a sheet thickness, and the separation of the edges of the second incision further reduces rigidity in the direction of erecting the element main body.

In the thermoelectric conversion module according to the disclosure, the predetermined direction is preferably a direction approximately orthogonal to an in-plane direction of the sheet-form thermoelectric conversion module in a state of the form A. By adopting such a configuration, the direction in which a stretcher pulls the thermoelectric conversion module coincides with the direction in which the thermoelectric conversion module is stretched, so the thermoelectric conversion module can be reliably stretched by an amount necessary for desired power generation.

In the thermoelectric conversion module according to the disclosure, the incision preferably extends spirally from an inner circumferential portion to an outer circumferential portion provided concentrically with the inner circumferential portion, in the thermoelectric conversion module in a state of the form A, and in a state of the form B, the inner circumferential portion preferably protrudes in a thickness direction of the thermoelectric conversion module, and at least one of the inner circumferential portion or the outer circumferential portion is preferably disposed in contact or proximity to the heat source. By adopting such a configuration, the thermoelectric conversion module has an axisymmetric structure, and each element body can perform stable power generation corresponding to the amount of protrusion of the inner circumferential portion.

In the thermoelectric conversion module according to the disclosure, a plurality of the incisions extending approximately in the same direction in an in-plane direction of the thermoelectric conversion module in a state of the form A is preferably disposed separately in a direction approximately orthogonal to an extension direction of the incisions, and by a stretcher alternately penetrating the plurality of the incisions from a front surface of the thermoelectric conversion module to a back surface and from the back surface to the front surface, the thermoelectric conversion module is preferably transformed into a state of the form B in which areas between adjacent incisions protrude to a front side of the thermoelectric conversion module and a back side alternately. By adopting such a configuration, the temperature difference can be reliably created in the element main body by making a portion of the substrate protrude stably in the sheet thickness direction, as the rod-shaped member alternately penetrates the incisions from the front surface of the thermoelectric conversion module to the back surface and from the back surface to the front surface. Therefore, the thermoelectric conversion characteristics can be improved.

In the thermoelectric conversion module according to the disclosure, a central portion that is provided at an approximately center position of the thermoelectric conversion module in a state of the form A in an in-plane direction and that is partitioned and formed by the incision with respect to an outer peripheral portion is preferably connected to the outer peripheral portion through an arm portion that is partitioned and formed by the incision with respect to the outer peripheral portion, and by disposing a stretcher between a back surface of the central portion and a front surface of the outer peripheral portion, the thermoelectric conversion module is preferably transformed into a state of the form B in which the central portion protrudes to a front side of the thermoelectric conversion module. By adopting such a configuration, the temperature difference can be reliably created in the element main body by making a portion of the substrate protrude stably in the sheet thickness direction. Therefore, the thermoelectric conversion characteristics can be improved.

Advantageous Effect

According to the disclosure, a sheet-form thermoelectric conversion module with excellent thermoelectric conversion characteristics can be provided.

BRIEF DESCRIPTION OF THE DRAWINGS

In the accompanying drawings:

FIG. 1A is a plan view illustrating a state of a form A of a thermoelectric conversion module (in which each element main body has a plurality element bodies) according to a first embodiment of the disclosure;

FIG. 1B is a plan view illustrating a state of the form A of the thermoelectric conversion module (in which each element main body has a single element body) according to the first embodiment of the disclosure;

FIG. 2A is a perspective view illustrating a state of a form B of the thermoelectric conversion module (in which each element main body has the plurality element bodies) according to the first embodiment of the disclosure;

FIG. 2B is a perspective view illustrating a state of the form B of the thermoelectric conversion module (in which each element main body has the single element body) according to the first embodiment of the disclosure;

FIG. 3B is a diagram illustrating a variation of the configuration of the element main bodies in the thermoelectric conversion module (in which each element main body has the plurality element bodies) according to the first embodiment of the disclosure;

FIG. 3D is a diagram illustrating a variation of the configuration (uni-leg type) of element main bodies in the thermoelectric conversion module (in which each element main body has the single element body) according to the first embodiment of the disclosure;

DETAILED DESCRIPTION

Figure 3A:
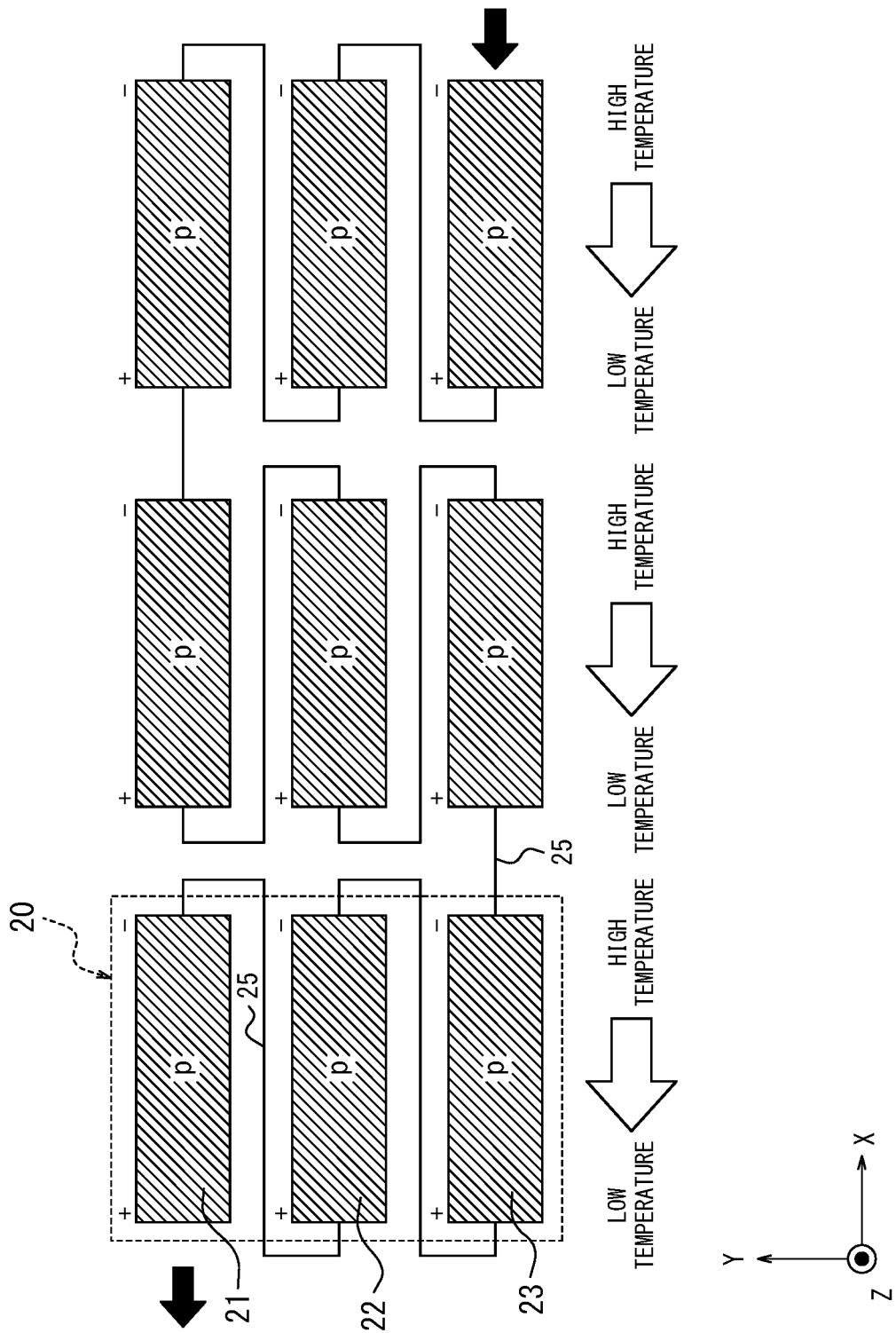
FIG. 3A is a diagram illustrating the configuration (uni-leg type) of element main bodies in the thermoelectric conversion module (in which each element main body has the plurality element bodies) according to the first embodiment of the disclosure.

Embodiments of the disclosure will be described below with reference to the drawings. In the drawings, common components are indicated with the same reference signs.

First Embodiment

FIGS. 1A to 3E illustrate the configuration of a thermoelectric conversion module 100, 101 according to a first embodiment of the disclosure. The thermoelectric conversion module 100 includes a substrate 10 formed in the form of a sheet, and an element main body 20 that is formed on the substrate and that generates power based on a temperature difference within the thermoelectric conversion module 100.

In the specification, claims, and drawings of this application, the left and right directions in FIG. 1A are referred to as an X-axis direction and the vertical direction in FIG. 1A is referred to as a Y-axis direction. The direction perpendicular to the paper surface in FIG. 1A is referred to as a Z-axis direction, with a positive side in the Z-axis direction being a front side of the thermoelectric conversion module 100 and a negative side in the Z-axis direction being a back side of the thermoelectric conversion module 100.

The substrate 10 has a rectangular shape with the X-axis direction as a longitudinal direction in a plan view illustrated in FIG. 1A. In this embodiment, a plurality of element main bodies 20, which perform thermoelectric conversion, are arranged at equal intervals in the longitudinal direction (X-axis direction) of the substrate 10.

The element main bodies 20 can be configured, for example, as illustrated in FIG. 3A, so that longitudinal ends of a plurality of strip-shaped element bodies 21 to 23, which are p-type thermoelectric conversion elements, are electrically connected in series to adjacent element bodies 21 to 23 by wiring 25. In the example of FIG. 3A, each element main body 20 has three element bodies 21 to 23 aligned in the Y-axis direction. In the example of FIG. 3A, the element bodies 21 to 23 can be composed of carbon nanotubes (CNTs), which are p-type thermoelectric conversion elements, for example. Note that, each element main body 20 may be configured to have a single element body 21, as illustrated in FIGS. 1B and 3D.

As illustrated in FIG. 1A, the substrate 10 has first incisions 11 that extend in the Y-axis direction in areas between the plurality of element main bodies 20 arranged in the X-axis direction and that are disposed at approximate center positions of the substrate 10 in the Y-axis direction, and second incisions 13 that extend from both sides of the element main bodies 20 in the Y-axis direction to both ends of the substrate 10 in the Y-axis direction. The first incisions 11 and the second incisions 13 are incisions penetrating in a thickness direction of the substrate 10, and are provided alternately in the longitudinal direction (X-axis direction) of the substrate 10 at approximately equal intervals.

The first incisions 11 extend in a shortitudinal direction (Y-axis direction) of the substrate 10 beyond the element main bodies 20 and are disposed at the approximate center positions of the substrate 10 in the shortitudinal direction (Y-axis direction). In the example of FIG. 1A, the first incisions 11 have a length equal to or greater than a half the shortitudinal length of the substrate 10, and both ends of the first incisions 11 terminate inside both shortitudinal ends of the substrate 10.

As illustrated in FIG. 1A, the element main bodies 20 are disposed at approximate center positions in the shortitudinal direction (Y-axis direction) of the substrate 10, and the second incisions 13 extend from both sides of the element main bodies 20 in the Y-axis direction to both ends of the substrate 10 in the Y-axis direction. The first incisions 11 and the second incisions 13 extend in parallel with each other in the Y-axis direction and are arranged alternately in the X-axis direction at approximately equal intervals.

The thermoelectric conversion module 100 in FIG. 1A illustrates an initial state in sheet form. This sheet form is referred to as "form A" in the specification and claims of this application. When the thermoelectric conversion module 100 of this form A is stretched in the left and right directions in FIG. 1A and both longitudinal ends of the thermoelectric conversion module 100 are attached to attachment portions 40, which are stretchers, as illustrated in FIG. 2A, mutually opposite edges 11a and 11b of the first incisions 11 and mutually opposite edges 13a and 13b of the second incisions 13 are separated from each other in the left and right directions in FIGS. 1A and 2A, which are predetermined stretch directions. This causes the right edges 11b and 13b in FIG. 2A to distort and deform upwardly and the left edges 11a and 13a in FIG. 1A to distort and deform downwardly. This distorted deformation of the edges of the first incisions 11 and the second incisions 13 causes, in the example of FIG. 1A, left ends of the element main bodies 20 to protrude upward (front side) in the sheet thickness direction. Also, right ends of the element main bodies 20 protrude downward (back side) in the sheet thickness direction (see FIG. 2A).

In the present embodiment, by stretching the thermoelectric conversion module 100 from a state of the form A to the left and right directions of FIG. 1A, which are predetermined directions, the thermoelectric conversion module 100 protrudes in the sheet thickness direction and becomes a three-dimensional structural form as illustrated in FIG. 2A. In the specification and claims of this application, this three-dimensional structural form is referred to as "form B". The form B is also identified by a different reference sign, such as "thermoelectric conversion module 101".

In the present embodiment, the thermoelectric conversion module 101 in a state of the form B is disposed on a heat source 30 as illustrated in FIG. 2A. Thereby, areas around longitudinal right ends of the plurality of element bodies 21 to 23 (see FIG. 3A), which constitute the element main bodies 20, become heat absorption portions that are disposed in proximity to the heat source 30. Areas at longitudinal left ends of the plurality of element bodies 21 to 23, which are on the opposite side to the heat source 30, function as heat dissipation portions that are cooled by natural convection of air. In FIG. 2A, a heat radiator with a lower temperature than the heat source 30 may be disposed above the thermoelectric conversion module 101 to increase the temperature difference of the plurality of element bodies 21 to 23 in the longitudinal direction by actively cooling the heat dissipation portions with the heat radiator. Note that, FIG. 2B illustrates the configuration of the form B when each element main body 20 has a single element body as illustrated in FIG. 1B.

FIG. 3A illustrates an example (so-called "uni-leg type") in which each element main body 20 is constituted of the plurality of strip-shaped element bodies 21 to 23, which are the p-type thermoelectric conversion elements. The area marked with a sign 20 in FIG. 1A corresponds to the area marked with a sign 20 in FIG. 3A. The white arrows in the drawing indicate heat fluxes from a high-temperature side to a low-temperature side of the element bodies 21 to 23, and the black arrows indicate the direction of current flowing through the element bodies 21 to 23. When a temperature difference occurs in each of the element bodies 21 to 23, holes move from the high-temperature side to the low-temperature side, so the p-type thermoelectric conversion element generates thermoelectromotive force in which the low-temperature side becomes a positive electrode. Therefore, as illustrated in FIG. 3A, by connecting in series an end of each of the plurality of element bodies 21 to 23 on the high-temperature side to an end of an adjacent element body 21, 22, or 23 on the low-temperature side by wiring 25, and by connecting in series an end on the low-temperature side to an end of an adjacent element body 21, 22, or 23 on the high-temperature side by wiring 25, the element main bodies 20 can obtain large thermoelectromotive force corresponding to the number of element bodies 21 to 23 connected.

When each element main body 20 has the single element body as illustrated in FIG. 1B, the element main bodies 20 can be constituted of single-type strip-shaped element bodies 21 that are p-type thermoelectric conversion elements, as illustrated in FIG. 3D, for example. In this case, an end of each of the element bodies 21 on the high-temperature side is connected in series to an end of an adjacent element body 21 on the low-temperature side by wiring 25, and an end of each of the element bodies 21 on the low-temperature side is connected in series to an end of an adjacent element body 21 on the high-temperature side by wiring 25.

As a material for the wiring 25, for example, silver paste or various metals such as gold, copper, aluminum, and nickel can be used. In the example of FIG. 3A, the explanation is based on the assumption that the p-type thermoelectric conversion elements are used for the element bodies 21 to 23, but n-type thermoelectric conversion elements may be used instead.

FIG. 3B illustrates a variation in which each element main body 20 is constituted of a plurality of strip-shaped element bodies 21, 22A, and 23 that include p-type thermoelectric conversion elements and an n-type thermoelectric conversion element. The area marked with a sign 20 in FIG. 1A corresponds to the area marked with a sign 20 in FIG. 3B. When a temperature difference occurs in each of the element bodies 21 and 23, which are p-type thermoelectric conversion elements, as described above, holes move from a high-temperature side to a low-temperature side, so the p-type thermoelectric conversion element generates thermoelectromotive force in which the low-temperature side becomes a positive electrode. When a temperature difference occurs in the element body 22A, which is n-type thermoelectric conversion element, electrons move from the high-temperature side to the low-temperature side, so the n-type thermoelectric conversion element generates thermoelectromotive force in which the high-temperature side becomes a positive electrode. Therefore, as illustrated in FIG. 3B, by connecting in series an end of each of the element bodies 21 and 23, which are the p-type thermoelectric conversion elements, on the high-temperature side to an end of an adjacent element body 22A, which is the n-type thermoelectric conversion element, on the high-temperature side or to an end of an adjacent element body 21 or 23, which is the p-type thermoelectric conversion element, on the low-temperature side by wiring 25, and by connecting in series an end of each of the element bodies 21 and 23, which are the p-type thermoelectric conversion elements, on the low-temperature side to an end of an adjacent element body 22A, which is the n-type thermoelectric conversion element, on the low-temperature side or to an end of an adjacent element body 21 or 23, which is the p-type thermoelectric conversion element, on the high-temperature side by wiring 25, the element main bodies 20 can obtain large thermoelectromotive force corresponding to the number of element bodies 21, 22A, and 23 connected.

Figure 3C:
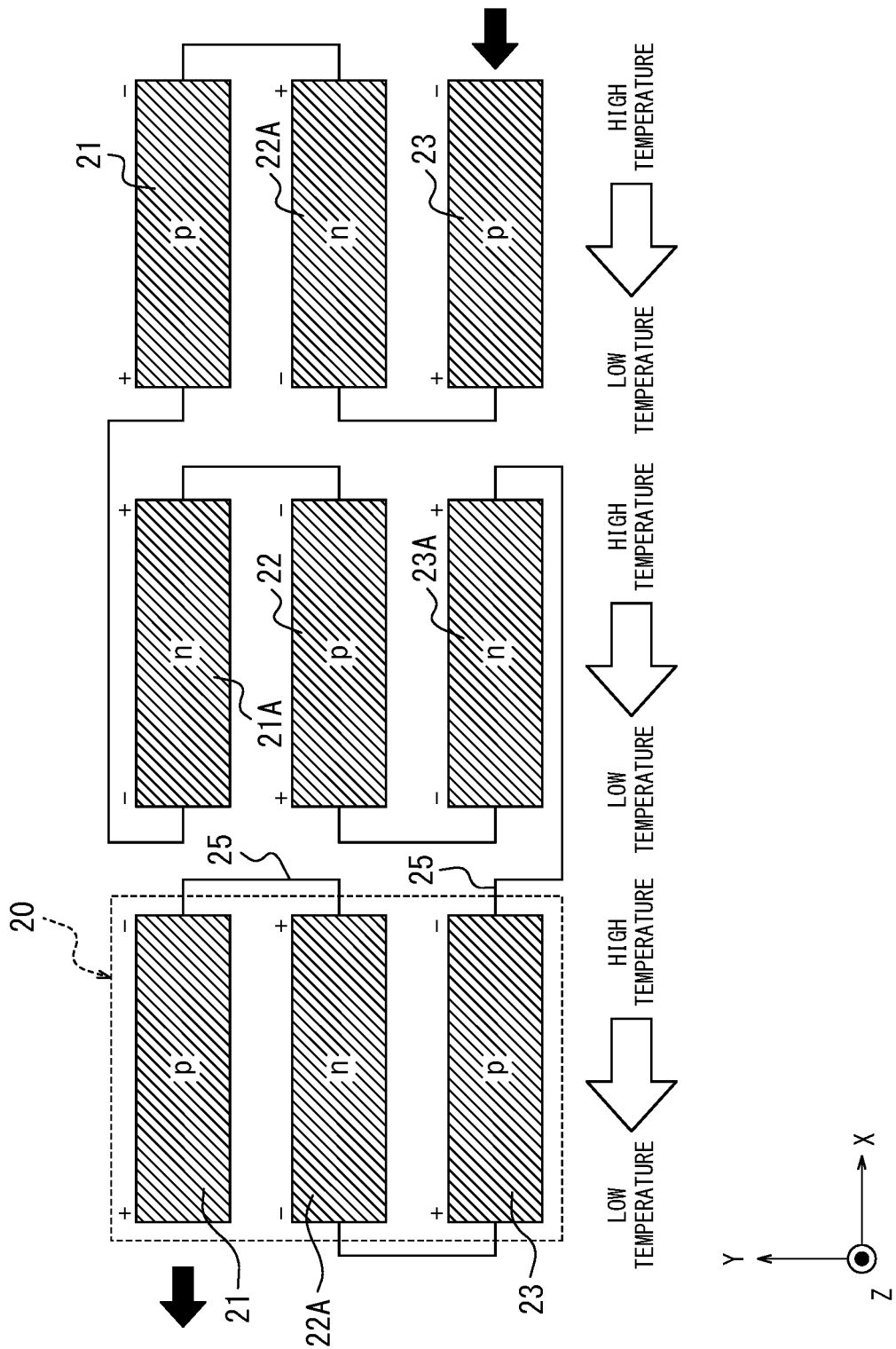
FIG. 3C is a diagram illustrating a variation of the configuration (7c type) of the element main bodies in the thermoelectric conversion module (in which each element main body has the plurality element bodies) according to the first embodiment of the disclosure.

FIG. 3C illustrates a variation (so-called "π type") in which each element main body 20 is constituted of a plurality of strip-shaped element bodies 21, 22A, and 23 that include p-type thermoelectric conversion elements and an n-type thermoelectric conversion element, or element bodies 21A, 22, and 23A that include a p-type thermoelectric conversion element and n-type thermoelectric conversion elements. The area marked with a sign 20 in FIG. 1A corresponds to the area marked with a sign 20 in FIG. 3C. When a temperature difference occurs in each of the element bodies 21, 22, and 23, which are p-type thermoelectric conversion elements, as described above, holes move from a high-temperature side to a low-temperature side, so the p-type thermoelectric conversion element generates thermoelectromotive force in which the low-temperature side becomes a positive electrode. When a temperature difference occurs in each of the element bodies 21A, 22A, and 23A, which are n-type thermoelectric conversion elements, electrons move from the high-temperature side to the low-temperature side, so the n-type thermoelectric conversion element generates thermoelectromotive force in which the high-temperature side becomes a positive electrode. Therefore, as illustrated in FIG. 3C, by connecting in series an end of each of the element bodies 21, 22, and 23, which are the p-type thermoelectric conversion elements, on the high-temperature side to an end of an adjacent element body 21A, 22A, or 23A, which is the n-type thermoelectric conversion element, on the high-temperature side by wiring 25, and by connecting in series an end of each of the element bodies 21, 22, and 23, which are the p-type thermoelectric conversion elements, on the low-temperature side to an end of an adjacent element body 21A, 22A, or 23A, which is the n-type thermoelectric conversion element, on the low-temperature side by wiring 25, the element main bodies 20 can obtain large thermoelectromotive force corresponding to the number of element bodies 21, 21A, 22, 22A, 23, and 23A connected.

Figure 3E:
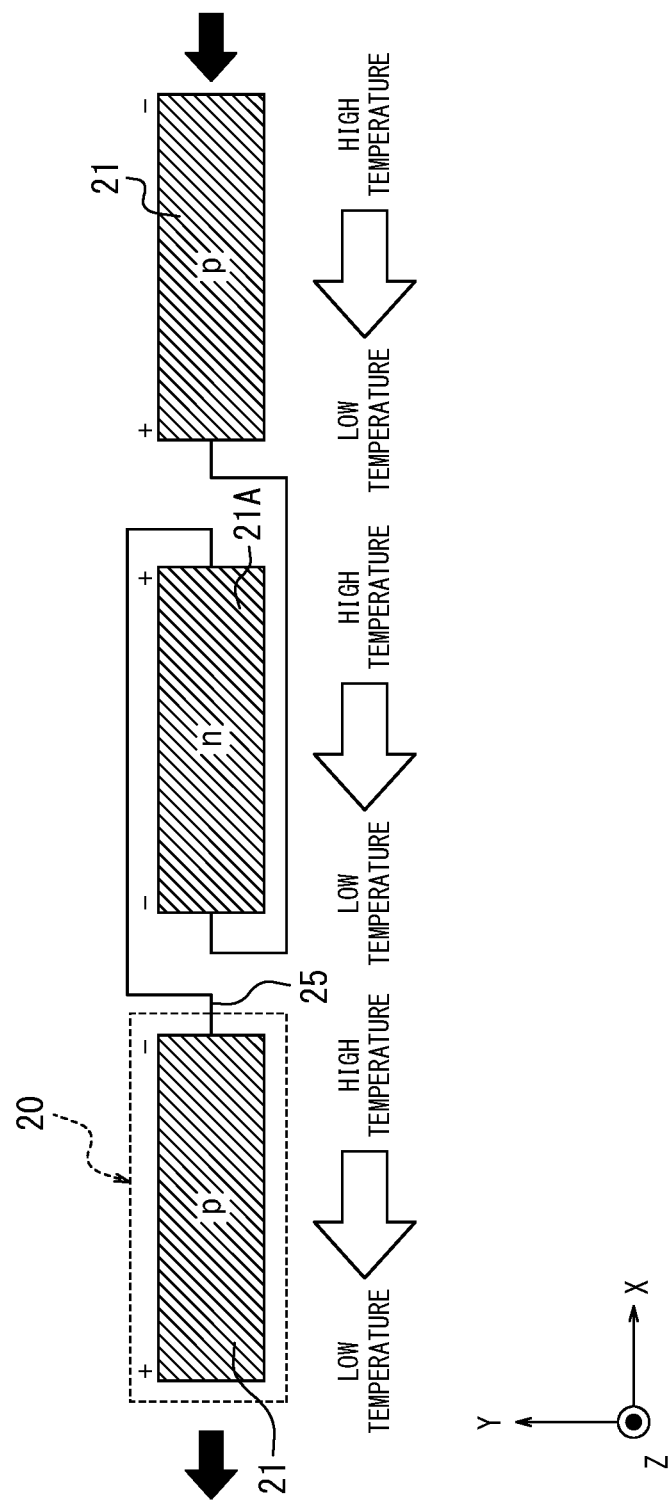
FIG. 3E is a diagram illustrating a variation of the configuration (7c type) of the element main bodies in the thermoelectric conversion module (in which each element main body has the single element body) according to the first embodiment of the disclosure.

When each element main body 20 has the single element body as illustrated in FIG. 1B, the element main bodies 20 can be constituted of strip-shaped element bodies 21, which are p-type thermoelectric conversion elements, and strip-shaped element bodies 21A, which are n-type thermoelectric conversion elements, as illustrated in FIG. 3E, for example. In this case, an end of each of the element bodies 21 on the high-temperature side is connected in series to an end of an adjacent element body 21A on the high-temperature side by wiring 25, and an end of each of the element bodies 21 on the low-temperature side is connected in series to an end of an adjacent element body 21A on the low-temperature side by wiring 25.

In the examples of FIGS. 3A to 3E, thermoelectric conversion materials for forming the p-type and n-type thermoelectric conversion elements constituting the element bodies 21 to 23 are not limited. Examples of the thermoelectric conversion materials include bismuth telluride compounds, antimony compounds, silicon compounds, metal oxide compounds, Heusler alloy compounds, conductive polymer compounds, conductive fibers, composites of these materials, and the like. Among these, the use of conductive fibers is preferable, and the use of fibrous carbon nanostructures such as carbon nanotubes (hereinafter referred to as CNTs) is more preferable. This is because the use of the CNTs can not only further improve the mechanical strength and reduce the weight of the thermoelectric conversion module 100 of the present disclosure, but also can be expected to increase the Seebeck coefficient itself of the element bodies 21 to 23 by stretching the thermoelectric conversion module 100, as described below. Furthermore, although single-walled CNTs and/or multi-walled CNTs can be used as the CNTs without any particular limitation, it is preferable that the CNTs are single-walled CNTs. This is because the single-walled CNTs tend to have superior thermoelectric characteristics (Seebeck coefficient). As the single-walled carbon nanotubes, CNTs that are produced according to the super growth method (see International Publication No. 2006/011655) in which, when CNTs are synthesized by the chemical vapor deposition method (CVD method) by supplying source compounds and carrier gas on a substrate having a catalyst layer for CNT production on its surface, a small amount of an oxidizing agent (catalyst activating material) is present in the system to dramatically improve catalytic activity of the catalyst layer can be used (CNTs produced according to this method may hereinafter be referred to as "SGCNTs").

Furthermore, the SGCNTs are characterized by having many bends. Here, CNTs are considered to have high thermal conductivity due to electron transfer, but also have a high thermal conductivity reduction effect due to phonon vibration. However, the SGCNTs have more bends than CNTs produced according to other common methods, so the SGCNTs have a structure in which phonon vibration is less likely to be amplified, and the reduction in thermal conductivity due to phonon vibration can be suppressed. Thus, the SGCNTs may be a more advantageous thermoelectric conversion material compared to other common CNTs.

Figure 4A:
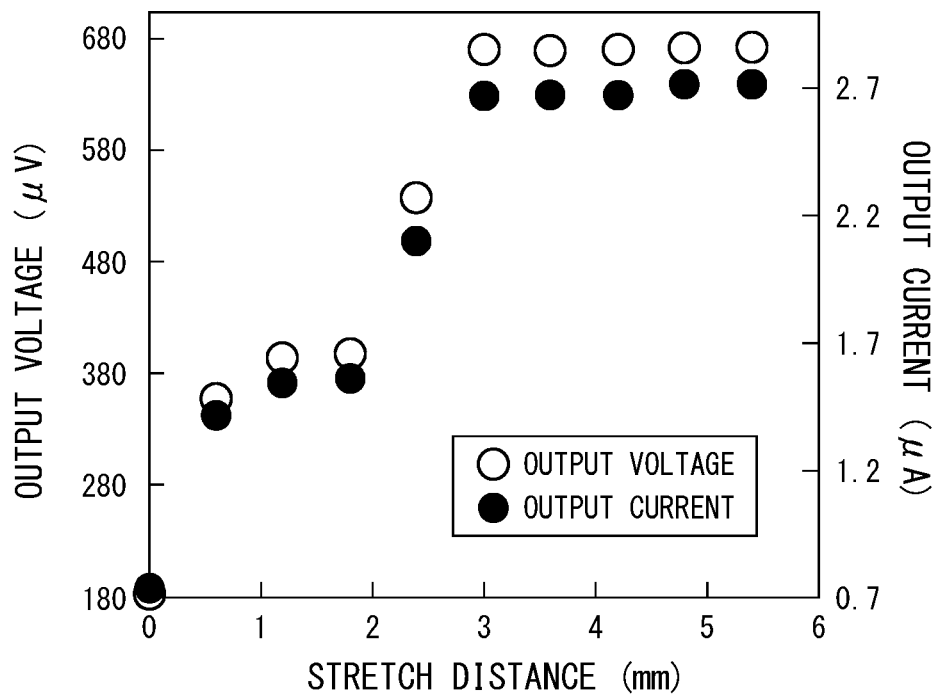
FIG. 4A is a graph illustrating the relationship between stretch distance and output voltage and output current when the thermoelectric conversion module is stretched in a longitudinal direction.
Figure 4B:
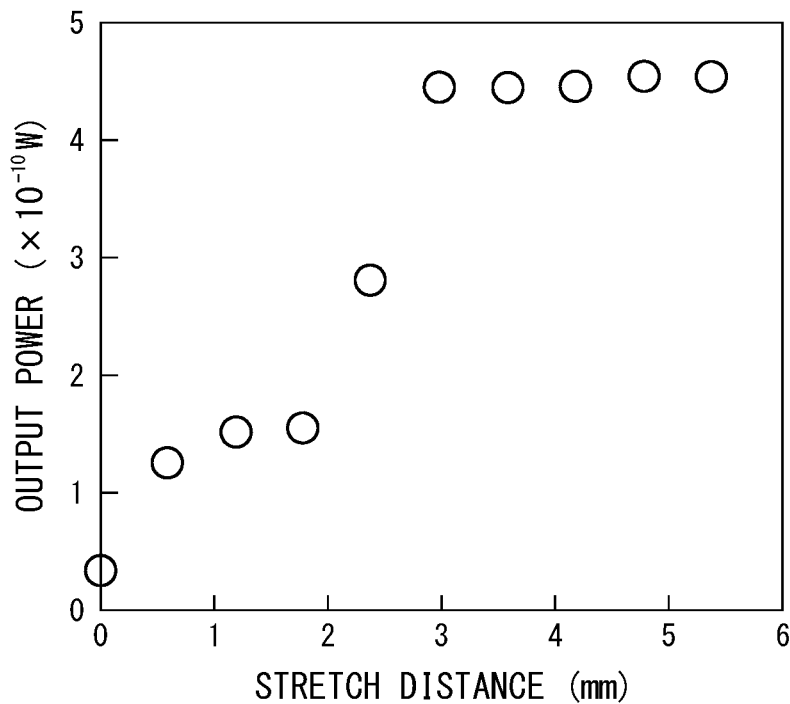
FIG. 4B is a graph illustrating the relationship between the stretch distance and the output power when the thermoelectric conversion module is stretched in the longitudinal direction.

The thermoelectric conversion characteristics of the thermoelectric conversion module when the CNTs are used for the thermoelectric conversion elements are described here. FIG. 4A illustrates the output voltage and output current of the thermoelectric conversion elements when the thermoelectric conversion module (however, in FIG. 1A, the entire form of the substrate 10 is composed of the thermoelectric conversion elements) is stretched in a state of being in proximity to the heat source. FIG. 4B illustrates the output power of the thermoelectric conversion elements when the thermoelectric conversion module is stretched. According to FIGS. 4A and 4B, stretching the thermoelectric conversion module in the longitudinal direction increases thermoelectromotive force in the thermoelectric conversion elements, and the output current and output power tend to increase accordingly. This can be explained by the following two reasons.

First, since stretching the thermoelectric conversion module in the longitudinal direction increases the angle between the longitudinal direction of the thermoelectric conversion element and a surface of the heat source, it is expected to increase a temperature difference within the thermoelectric conversion element and thus increase thermoelectromotive force in the thermoelectric conversion element.

Figure 4C:
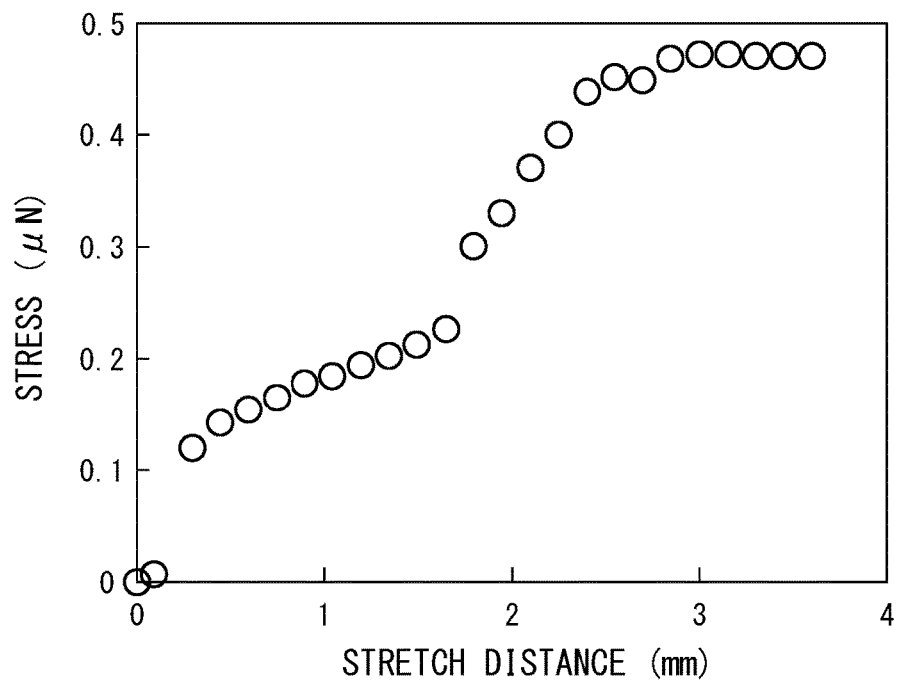
FIG. 4C is a graph illustrating the relationship between the stretch distance and tensile stress when the thermoelectric conversion module is stretched in the longitudinal direction.
Figure 4D:
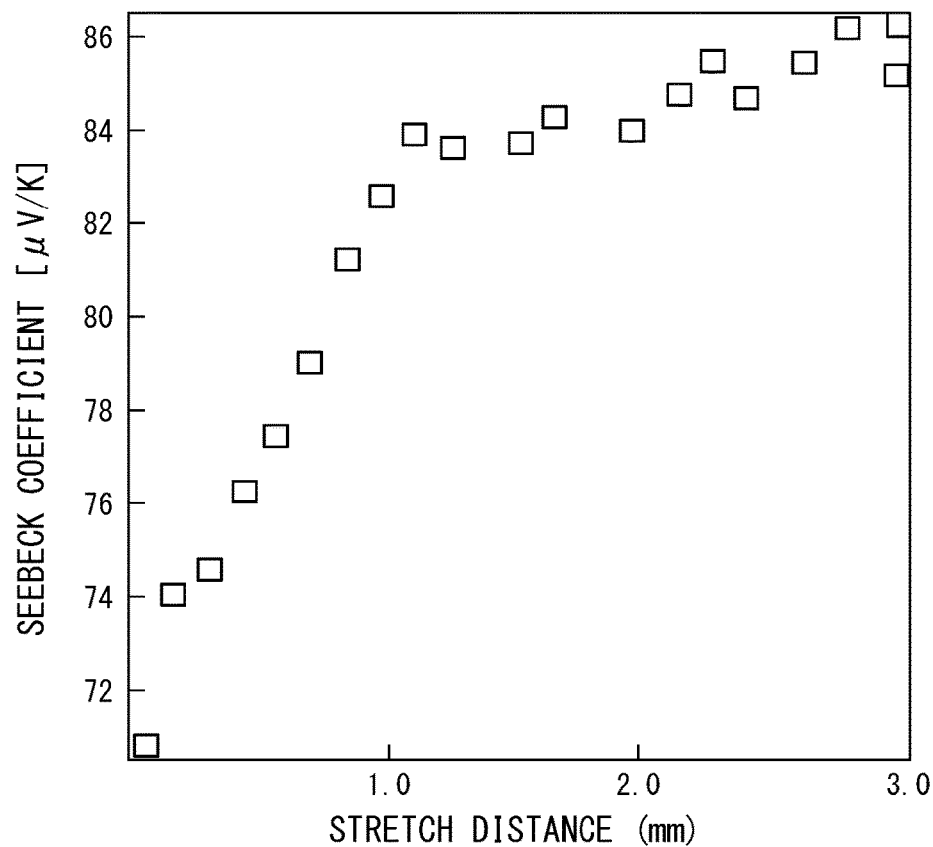
FIG. 4D is a graph illustrating the relationship between the stretch distance and Seebeck coefficient when the thermoelectric conversion module is stretched in the longitudinal direction.

Second, by stretching the thermoelectric conversion module in the longitudinal direction, as illustrated in FIG. 4C, tensile stress on the thermoelectric conversion module increases, which in turn increases the Seebeck coefficient itself of the thermoelectric conversion element, as illustrated in FIG. 4D, and thus increases thermoelectric conversion efficiency.

The results of quantum calculations indicate that increase in Seebeck coefficient itself due to stretching of the thermoelectric conversion module is due to change in electronic structure when a single CNT undergoes a structural change such as bending. In other words, the Seebeck coefficient is thought to increase due to change in electrical characteristics caused by bending of the CNTs.

When Seebeck coefficient itself is increased by stretching the thermoelectric conversion module in the longitudinal direction, the CNTs alone may be used as a material for the thermoelectric conversion elements, or, for example, the CNTs blended with a copolymer (VDF-TrFE) of vinylidene fluoride and trifluoroethylene may be used. When the CNTs are blended with other materials to increase Seebeck coefficient by stretching, the other materials are not limited to the above, but can be any material that enhances the electronic change of the CNTs. Especially, ferroelectric materials with spontaneous polarization in molecules are preferable.

Figure 5A:
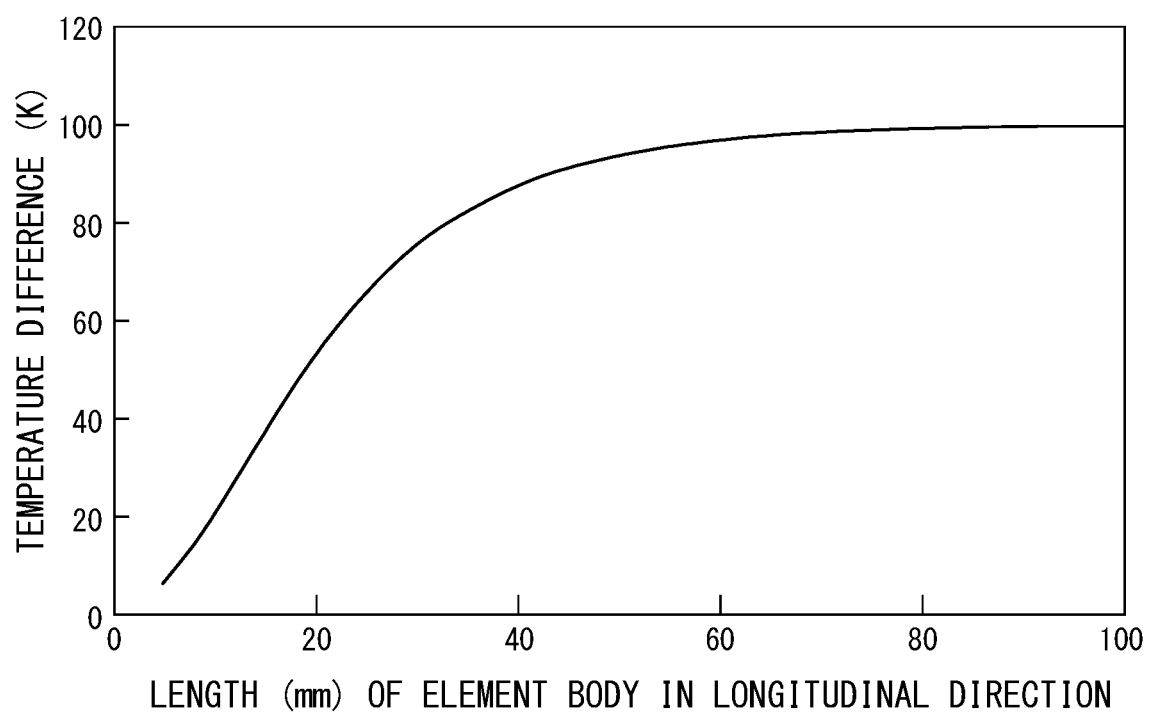
FIG. 5A is a graph illustrating the relationship between the length of an element body in the longitudinal direction and a temperature difference generated in the longitudinal direction of the element body.

The length of the strip-shaped element bodies 21 to 23 in the longitudinal direction is preferably 30 [mm] or more, more preferably 40 [mm] or more, and most preferably 60 [mm] or more. When the element body contains the CNTs, assuming the following conditions: the thickness of the element body is 80 [μm], the heat conductivity of the element body in a plane direction is 10 [W/(m·K)], the heat conductivity of the element body in the thickness direction is 0.1 [W/(m·K)], and the temperature difference between a heat source temperature and an ambient temperature is 100 [K], the temperature difference within the element body standing on the surface of the heat source is simulated as FIG. 5A. In other words, when the length of the element body is at least 30 [mm] or more, the temperature difference within the element body is easily ensured. It is found from the simulation result that when the length of the element body in the longitudinal direction exceeds 10 [mm], the thickness or the like of the substrate, whose heat conductivity is two orders of magnitude smaller than that of the CNTs, does not have much effect on the temperature difference in the element body.

Since the CNTs are an expensive material, the applicant has considered what size of a strip of the single element body 21, 22, or 23 improves thermoelectric conversion efficiency when the amount of the CNTs used (total area of the element bodies 21 to 23) is the same.

In the present embodiment, as illustrated in FIG. 3A and the like, the plurality of strip-shaped element bodies 21 to 23 are connected. Assuming that the total area of the element bodies 21 to 23 is constant, when the width of the single element body (width in the Y-axis direction in FIG. 3A) is fixed, the product of the length in the longitudinal direction (length in the X-axis direction in FIG. 3A) and the number of element bodies is constant.

Figure 5B:
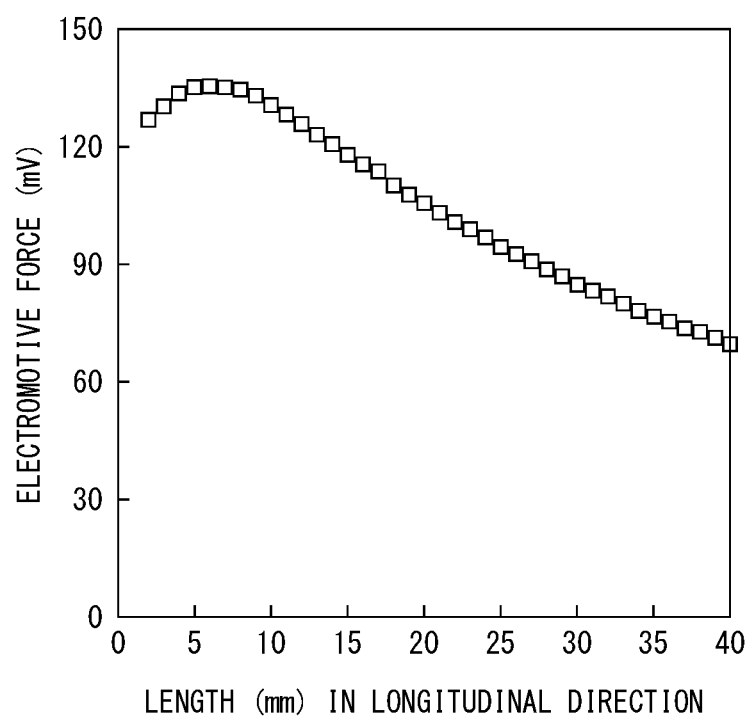
FIG. 5B is a graph illustrating the relationship between the length of an element body in the longitudinal direction and electromotive force generated.

For example, when d represents the width of the element body, L1 represents the length L in the longitudinal direction, and n1 represents the number n of element bodies, the total area S of the element bodies is S=d×L1×n1. When the length L in the longitudinal direction is L2 and the number n of element bodies is n2, S=d×L2×n2, which means that when the length in the longitudinal direction is doubled, the number n of element bodies is ½. In this case, the longer the length L in the longitudinal direction, the larger the temperature difference between both longitudinal ends can be, so the electromotive force of the single element body becomes larger, but the number n of element bodies is reduced. Since final electromotive force obtained by the thermoelectric conversion module is the electromotive force of the single element body×the number n of element bodies, assuming that the total area S of the element bodies is constant, the final electromotive force obtained varies between the case of increasing the temperature difference of the single element body by increasing the length L of the element body in the longitudinal direction and the case of increasing the number n of element bodies by shortening the length L of the element body in the longitudinal direction. It is considered that there is an optimal value for the length L of the element body in the longitudinal direction that produces the greatest electromotive force. FIG. 5B illustrates results of simulation study of this, and it is found that the highest electromotive force is obtained when the length L of the element body in the longitudinal direction is 6 mm. According to FIG. 5B, the electromotive force decreases significantly when the length L of the element body in the longitudinal direction is 5 mm or less, whereas the electromotive force decreases gradually when the length L of the element body in the longitudinal direction is increased. From this point of view, the length L of the element body in the longitudinal direction is preferably 5 mm or more and 12 mm or less, and more preferably 5 mm or more and 8 mm or less.

The heat conductivity of the substrate is preferably small compared to that of the thermoelectric conversion element, for example, 5.0 [W/(m·K)] or less when the CNTs are used for the thermoelectric conversion element. The heat conductivity of the substrate is more preferably 1.0 [W/(m·K)] or less, and most preferably 0.1 [W/(m·K)] or less. As a material for the substrate, for example, paper (heat conductivity: 0.06 [W/(m·K)]), wood (0.2 [W/(m·K)]), polyethylene (0.3 [W/(m·K)]), rubber (0.15 [W/(m·K)]), polyimide (0.3 [W/(m·K)]), or the like can be used.

First Variation of First Embodiment

Next, a first variation of the thermoelectric conversion module according to the first embodiment of the present disclosure will be described using FIGS. 6 and 7.

Figure 6:
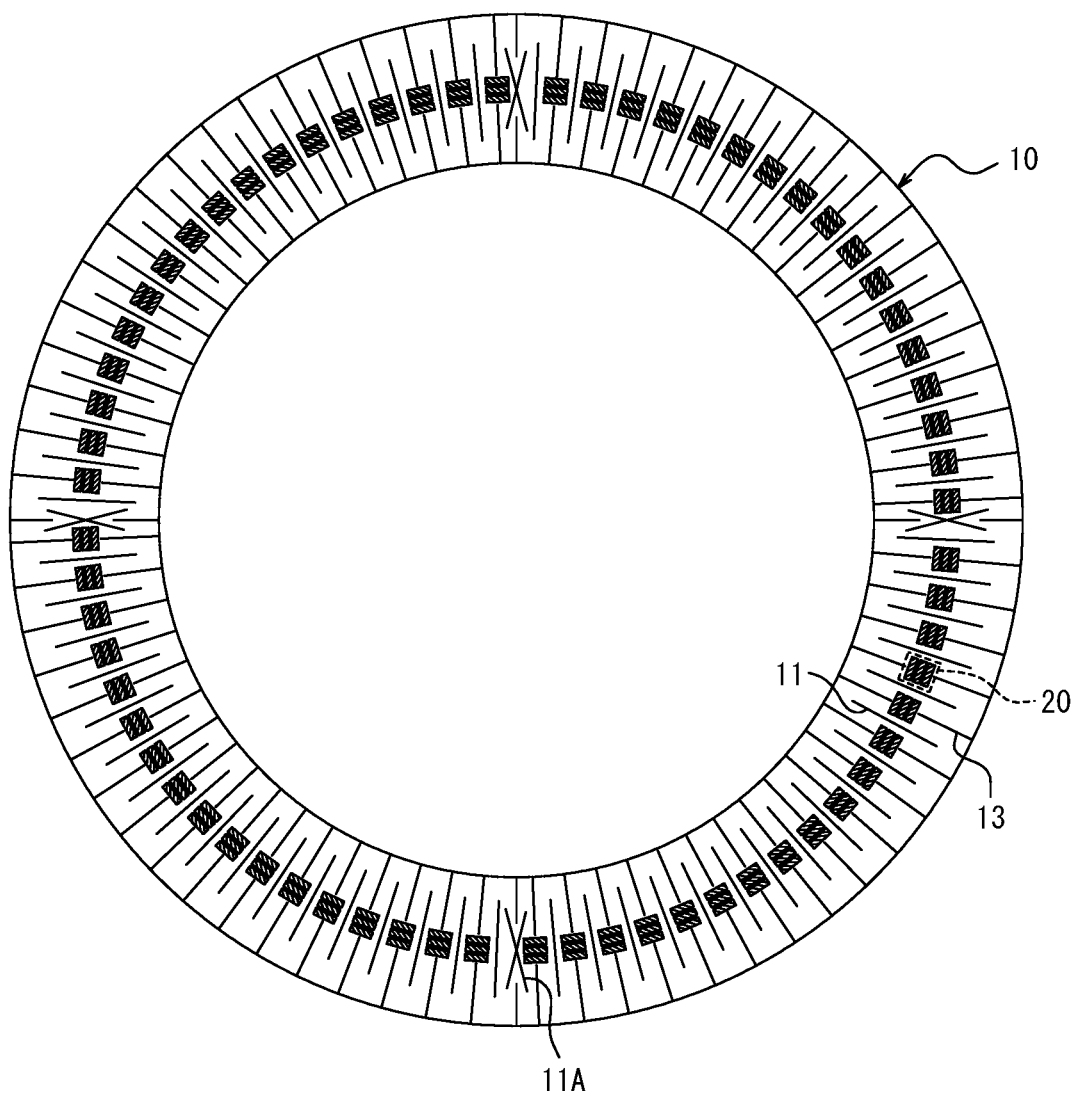
FIG. 6 is a plan view illustrating a state of the form A of a first variation of the thermoelectric conversion module according to the first embodiment of the disclosure.

As illustrated in FIG. 6, a thermoelectric conversion module 110 according to the first variation of the first embodiment includes a sheet-form substrate 10 formed in an annular shape and element main bodies 20 that are formed on the substrate 10 and that generate power based on temperature differences.

The substrate 10 is a sheet-form member having an annular shape in a plan view illustrated in FIG. 6. As illustrated in FIG. 6, the substrate 10 has first incisions 11 that extend in a radial direction in areas between the plurality of element main bodies 20 arranged in a circumferential direction and that are disposed at approximate center positions of the substrate 10 in the radial direction, and second incisions 13 that extend from both radial sides of the element main bodies 20 to both radial ends of the substrate 10. The first incisions 11 and the second incisions 13 are incisions penetrating in the thickness direction of the substrate 10, and are provided alternately in the circumferential direction of the substrate 10.

The first incisions 11 extend in the radial direction of the substrate 10 beyond the element main bodies 20 and are disposed at the approximate center positions of the substrate 10 in the radial direction. The first incisions 11 have a length equal to or greater than a half the radial length of the substrate 10, and both ends of the first incisions 11 terminate inside both radial ends of the substrate 10.

On the other hand, as illustrated in FIG. 6, the element main bodies 20 are disposed at approximate center positions in the radial direction of the substrate 10, and the second incisions 13 extend from both radial sides of the element main bodies 20 to both radial ends of the substrate 10. Both the first incisions 11 and the second incisions 13 extend in the radial direction and are disposed alternately in the circumferential direction at approximately equal intervals.

The thermoelectric conversion module 110 in FIG. 6 illustrates an initial state (form A) in sheet form. When the thermoelectric conversion module 110 of this form A is transformed so that the radial direction of the thermoelectric conversion module 110 is oriented in a vertical direction, and attached to an outer periphery of an approximately cylindrical heat source 41 illustrated in FIG. 7, which is a stretcher, mutually opposite edges 11a and 11b of the first incisions 11 and mutually opposite edges 13a and 13b of the second incisions 13 are separated from each other in a circumferential direction of the cylindrical heat source 41, which is a predetermined stretch direction. This causes one edge 11b of the first incision 11 and one edge 13b of the second incision 13 to distort and deform outwardly in a radial direction of the heat source 41, and the other edges 11a and 13a to distort and deform inwardly in the radial direction of the heat source 41. This distorted deformation of the edges of the first incisions 11 and the second incisions 13 causes, in the example of FIG. 7, left ends of the element main bodies 20 to protrude outwardly in the radial direction of the heat source 41 in the sheet thickness direction. Also, right ends of the element main bodies 20 protrude inwardly in the radial direction of the heat source 41 in the sheet thickness direction (see FIG. 7).

Figure 7:
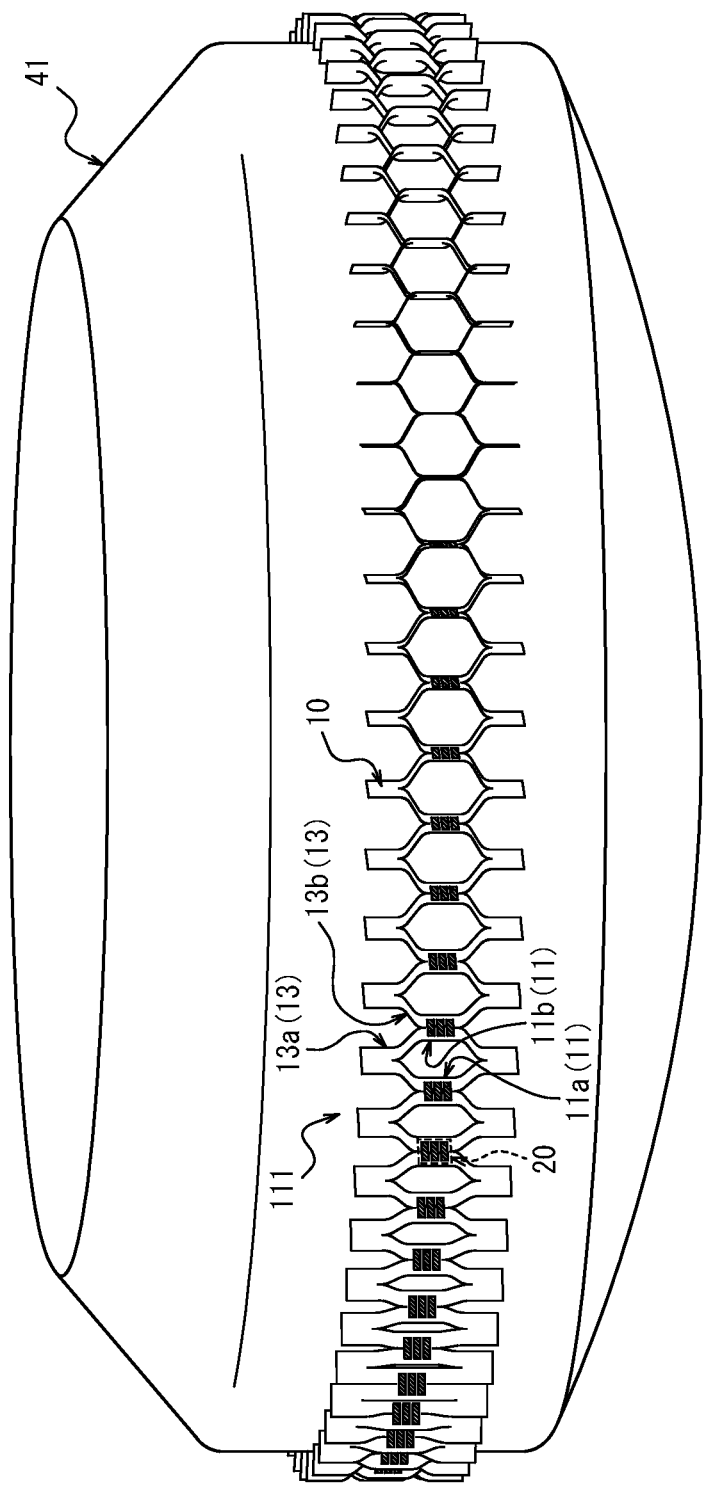
FIG. 7 is a perspective view illustrating a state of the form B of the first variation of the thermoelectric conversion module according to the first embodiment of the disclosure.

In the present embodiment, by stretching the thermoelectric conversion module 110 from a state of the form A to the circumferential direction of the heat source 41, which is a predetermined direction, the thermoelectric conversion module 110 protrudes in the sheet thickness direction and becomes a three-dimensional structural form (form B) as illustrated in FIG. 7. The form B is identified by a different reference sign from the form A, such as "thermoelectric conversion module 111".

In the present embodiment, the thermoelectric conversion module 111 in a state of the form B is disposed on the outer periphery of the heat source 41 as illustrated in FIG. 7. Thereby, areas around longitudinal right ends of a plurality of element bodies, which constitute the element main bodies 20, become heat absorption portions that are disposed in proximity to the heat source 41. Areas at longitudinal left ends of the plurality of element bodies, which are on the opposite side to the heat source 41, function as heat dissipation portions that are cooled by natural convection of air.

In this variation, as illustrated in FIG. 6, mutually intersecting third incisions 11A are provided at four locations in the circumferential direction. By intermittently providing the mutually intersecting incisions in the circumferential direction, inner and outer circumferential sides can be swapped by reversing one of two sides upside down at the third incision 11A when the thermoelectric conversion module 110 is transformed from the annular form in the form A illustrated in FIG. 6 to the form B illustrated in FIG. 7. This configuration can prevent, in the transformation from the form A into the form B, the inner circumferential side having a short circumferential length from distorting significantly in the circumferential direction.

The variation illustrated in FIG. 6 has such a form that the thermoelectric conversion module 100 extending in the left and right directions in FIG. 1A is extended in the circumferential direction. Thus, as the configurations of the element main bodies 20, for example, the configurations illustrated in FIGS. 3A to 3E can be adopted.

Second Variation of First Embodiment

Next, a second variation of the thermoelectric conversion module according to the first embodiment of the present disclosure will be described using FIGS. 8 and 9.

Figure 8:
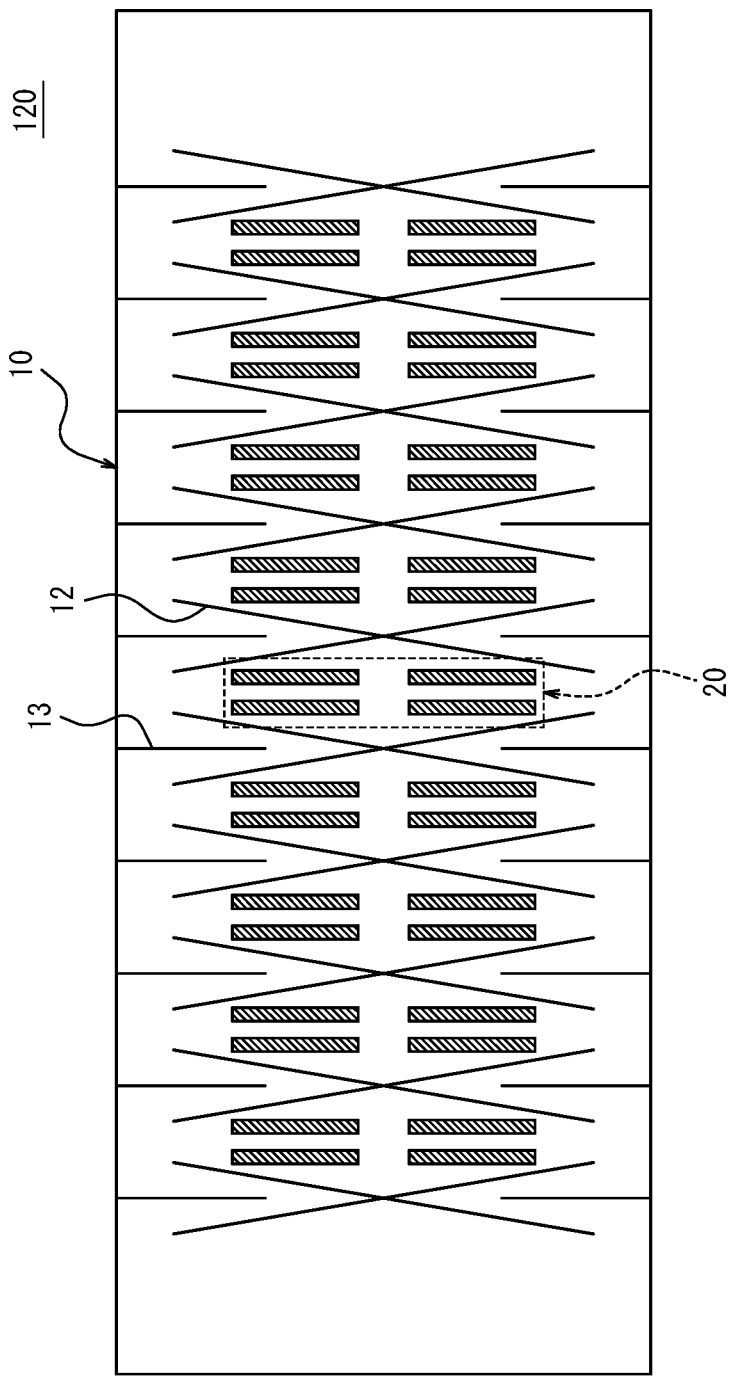
FIG. 8 is a plan view illustrating a state of the form A of a second variation of the thermoelectric conversion module according to the first embodiment of the disclosure.

As illustrated in FIG. 8, a thermoelectric conversion module 120 according to the second variation of the first embodiment includes a sheet-form substrate 10 formed in a rectangular shape and element main bodies 20 that are formed on the substrate 10 and that generate power based on temperature differences.

The substrate 10 is a sheet-form member having a rectangular shape in a plan view illustrated in FIG. 8. In the substrate 10, as illustrated in FIG. 8, a total of four element bodies (the element bodies surrounded by the dashed line with a sign 20 in FIG. 8), two in the shortitudinal direction (Y-axis direction) and two in the longitudinal direction (X-axis direction) of the substrate 10, is defined as one unit (element main body 20), and a plurality of the units is arranged in the longitudinal direction of the substrate 10. In each of areas between the plurality of element main bodies 20 in the X-axis direction, there are first incisions 12 that are disposed at approximate center positions of the substrate 10 in the Y-axis direction and that cross each other, and second incisions 13 that extend from both sides of the element main body 20 in the Y-axis direction to both ends of the substrate 10 in the Y-axis direction. The first incisions 12 and the second incisions 13 are incisions penetrating in the thickness direction of the substrate 10.

The thermoelectric conversion module 120 in FIG. 8 illustrates an initial state "form A" in sheet form. When the thermoelectric conversion module 120 of this form A is stretched in the left and right directions (X-axis direction) in FIG. 8 and both longitudinal ends of the thermoelectric conversion module 120 are attached to not-illustrated attachment portions, which are stretchers, mutually opposite edges 12*a* and 12*b* of the first incisions 12 and mutually opposite edges 13*a* and 13*b* of the second incisions 13 are separated from each other in the left and right directions in FIGS. 8 and 9, which are predetermined stretch directions. Thereby, spear-tip-shaped portions surrounded by the first and second incisions 12 and 13, which connect the element main bodies 20 in FIG. 8, are stretched in the X-axis direction. Since the stretch of the spear-tip-shaped portions draws both ends of the substrate 10 in the Y-axis direction toward the center in the Y-axis direction, areas with the element main bodies 20 protrude in the Z-axis direction, as illustrated in FIG. 9, and the thermoelectric conversion module 120 is transformed into a three-dimensional structural form, "form B".

Figure 9:
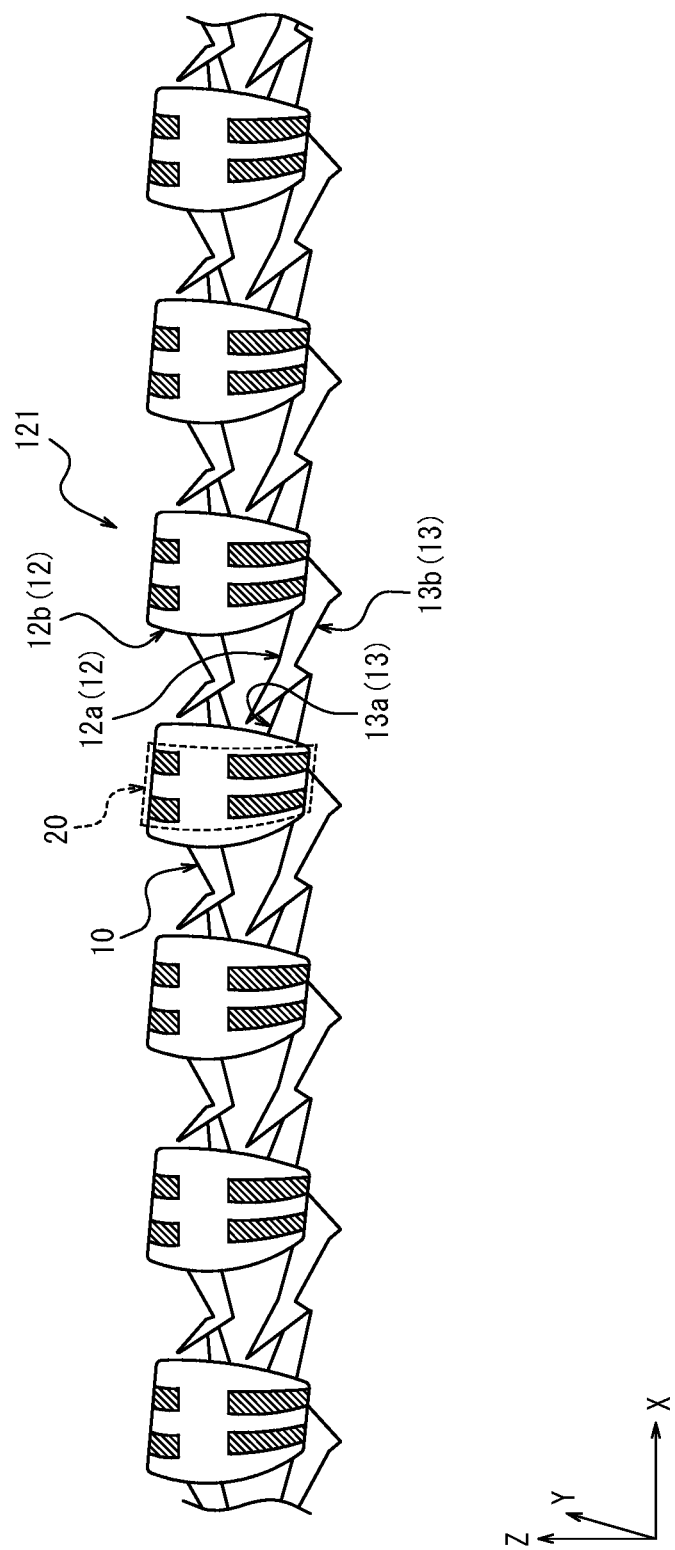
FIG. 9 is a perspective view illustrating a state of the form B of the second variation of the thermoelectric conversion module according to the first embodiment of the disclosure.

When the thermoelectric conversion module 121 in the form B illustrated in FIG. 9 is disposed on a not-illustrated heat source, the above-described spear-tip-shaped portions stretched in the X-axis direction function as heat absorption portions by being disposed in proximity to the heat source, and temperature is increased at both ends of each element main body 20 in the Y-axis direction. In this way, both the ends of each element main body 20 in the Y-axis direction become high-temperature sides and the center of each element main body 20 in the Y-axis direction becomes a low-temperature side, and therefore a temperature difference occurs in each element main body in the longitudinal direction.

In this variation, as in FIG. 3A, by connecting in series an end of each of element bodies, which are multiple p-type thermoelectric conversion elements, on the high-temperature side to an end of an adjacent element body on the low-temperature side by wiring, and by connecting in series an end on the low-temperature side to an end of an adjacent element body on the high-temperature side by wiring, the element main bodies 20 can obtain large thermoelectromotive force corresponding to the number of element bodies connected.

In this variation, as in FIG. 3B, by connecting in series an end of each of element bodies, which are p-type thermoelectric conversion elements, on the high-temperature side to an end of an adjacent element body, which is an n-type thermoelectric conversion element, on the high-temperature side or to an end of an adjacent element body, which is a p-type thermoelectric conversion element, on the low-temperature side by wiring, and by connecting in series an end of each of the element bodies, which are the p-type thermoelectric conversion elements, on the low-temperature side to an end of an adjacent element body, which is an n-type thermoelectric conversion element, on the low-temperature side or to an end of an adjacent element body, which is a p-type thermoelectric conversion element, on the high-temperature side by wiring, the element main bodies 20 can obtain large thermoelectromotive force corresponding to the number of element bodies connected.

In this variation, as in FIG. 3C, by connecting in series an end of each of element bodies, which are p-type thermoelectric conversion elements, on the high-temperature side to an end of an adjacent element body, which is an n-type thermoelectric conversion element, on the high-temperature side by wiring, and by connecting in series an end of each of the element bodies, which are the p-type thermoelectric conversion elements, on the low-temperature side to an end of an adjacent element body, which is an n-type thermoelectric conversion element, on the low-temperature side by wiring, the element main bodies 20 can obtain large thermoelectromotive force corresponding to the number of element bodies connected.

Third and Fourth Variations of First Embodiment

Next, third and fourth variations of the thermoelectric conversion module according to the first embodiment of the present disclosure will be described using FIGS. 10 and 11.

Figure 10:
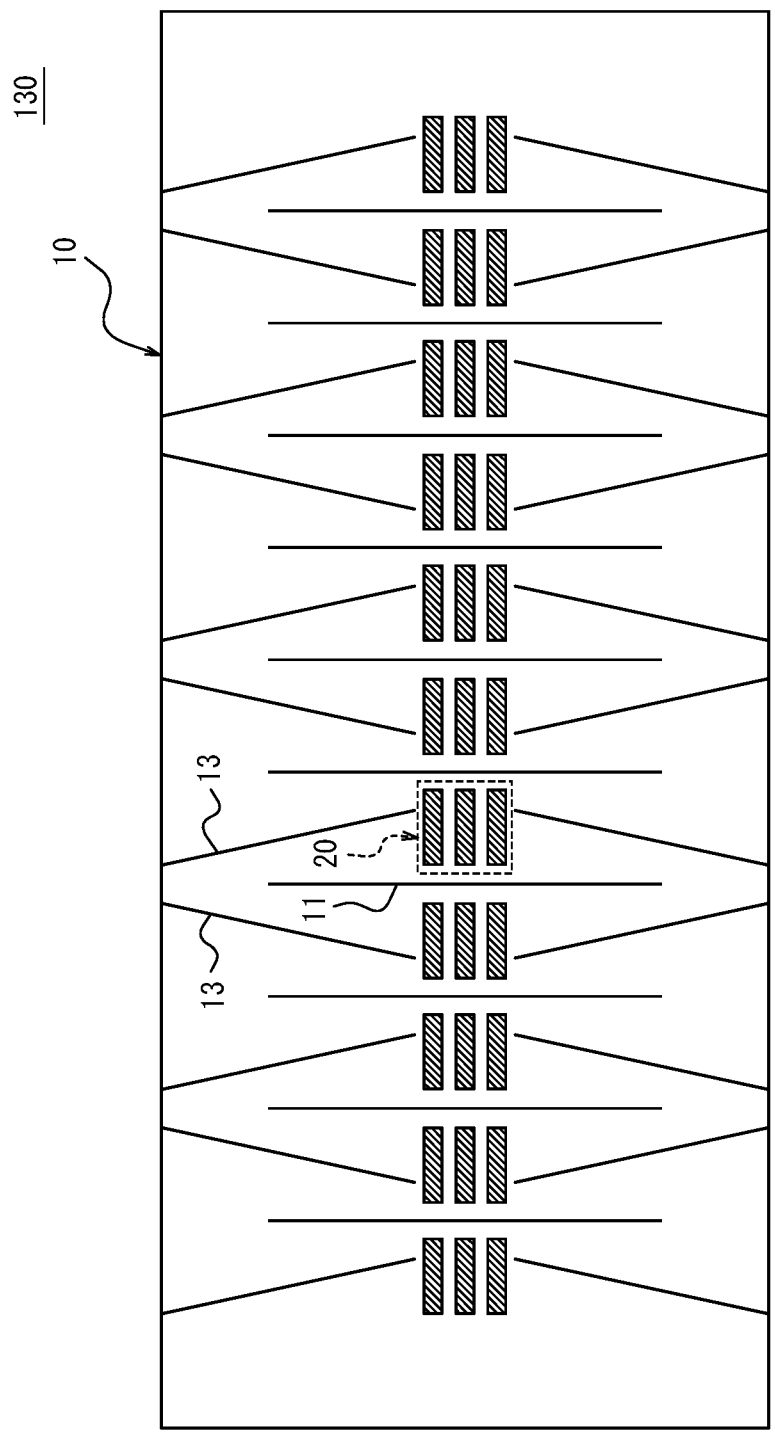
FIG. 10 is a plan view illustrating a state of the form A of a third variation of the thermoelectric conversion module according to the first embodiment of the disclosure.
Figure 11:
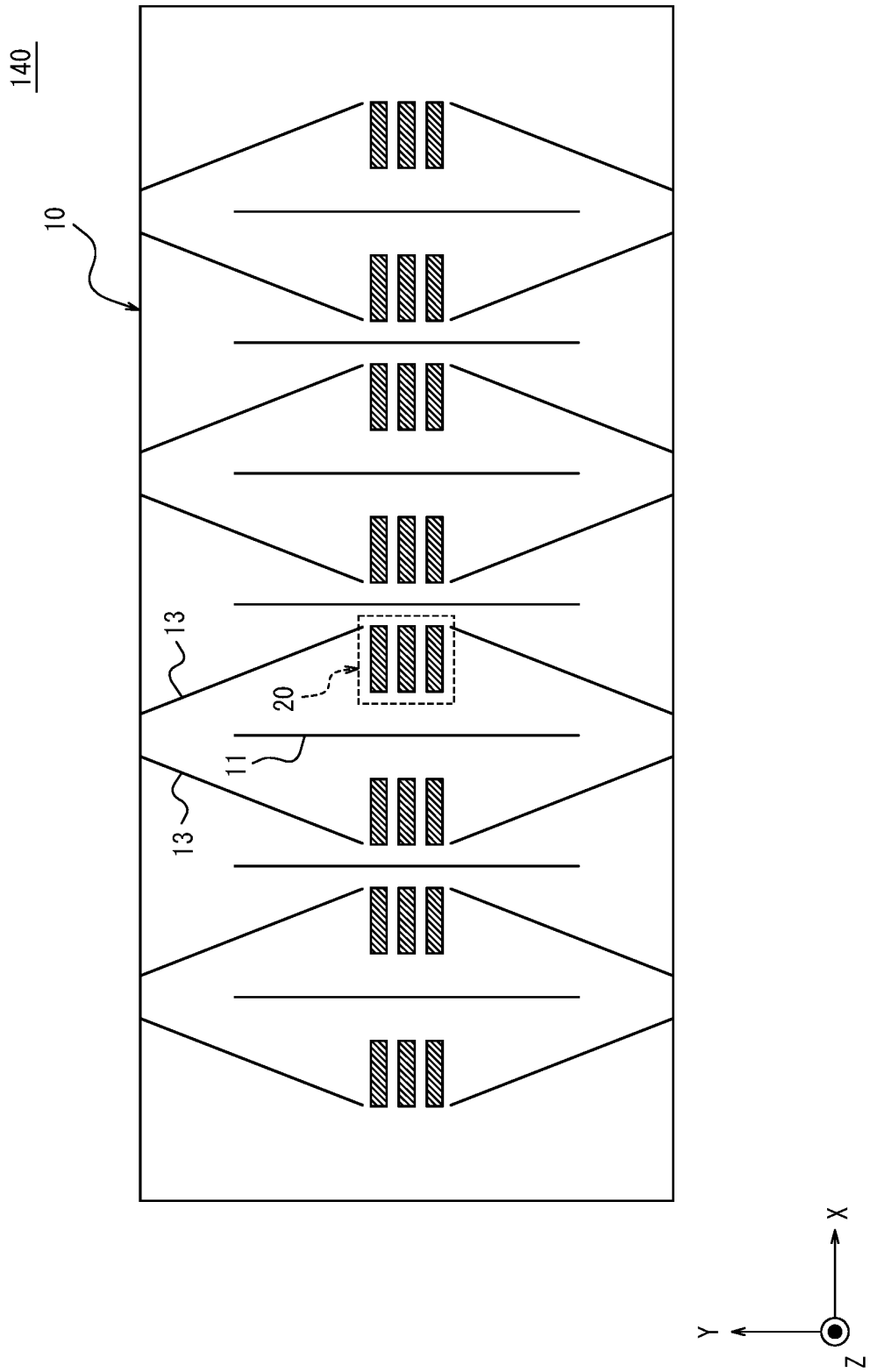
FIG. 11 is a plan view illustrating a state of the form A of a fourth variation of the thermoelectric conversion module according to the first embodiment of the disclosure.

As illustrated in FIGS. 10 and 11, a thermoelectric conversion module 130 according to the third variation of the first embodiment and a thermoelectric conversion module 140 according to the fourth variation thereof each include a sheet-form substrate 10 formed in a rectangular shape and element main bodies 20 that are formed on the substrate 10 and that generate power based on temperature differences.

The thermoelectric conversion module 130 according to the third variation, compared to the first embodiment, approximates the first embodiment, except that second incisions 13, which are provided at line symmetrical positions with respect to first incisions 11 oriented in the Y-axis direction, extend at an angle to the Y-axis direction. The fourth variation illustrated in FIG. 11 also approximates the configuration of the third variation, except that the pitch of incisions in the X-axis direction is different compared to that of the third variation. Therefore, a detailed description here is omitted.

Fifth Variation of First Embodiment

Next, a fifth variation of the thermoelectric conversion module according to the first embodiment of the present disclosure will be described using FIGS. 12 and 13.

Figure 12:
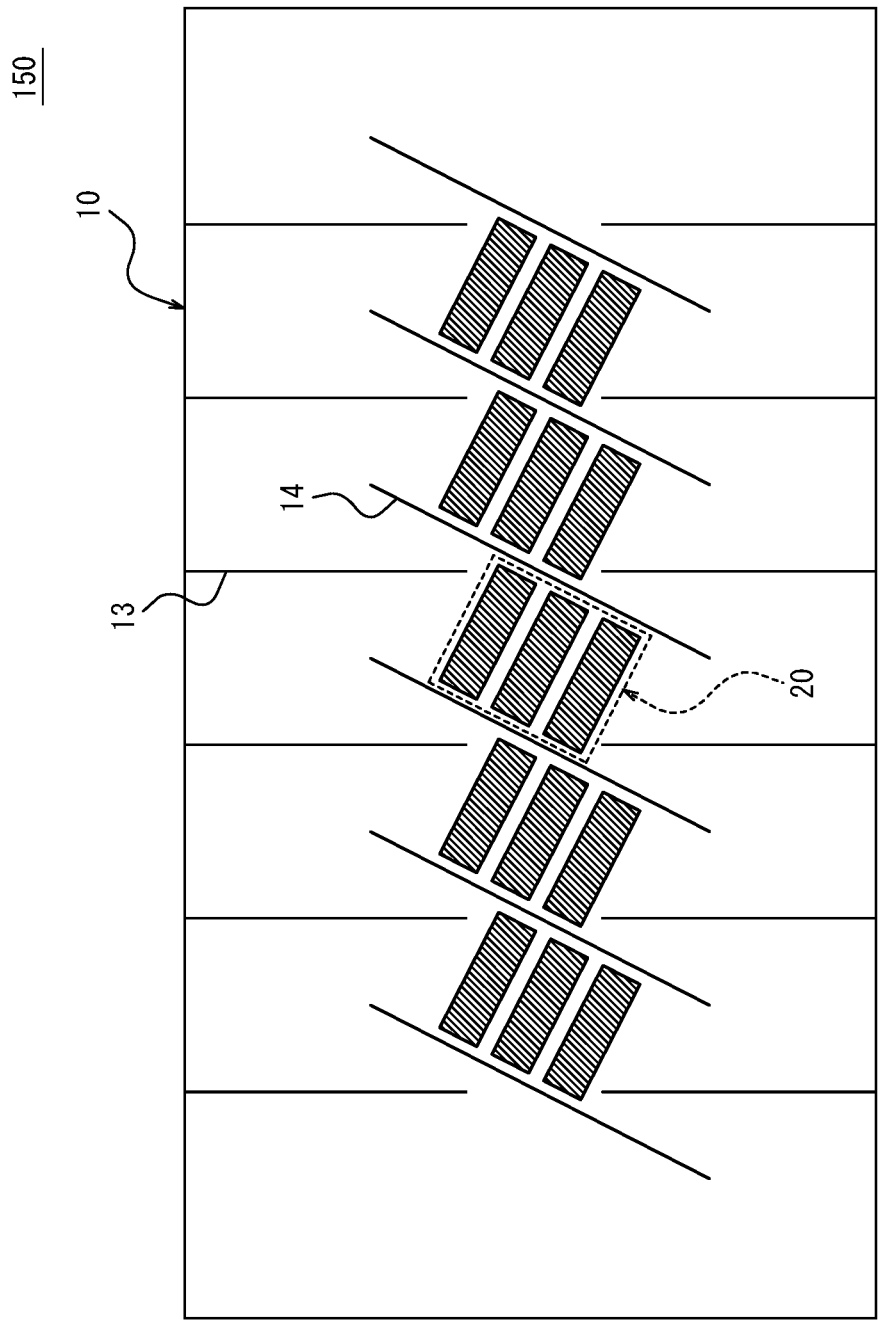
FIG. 12 is a plan view illustrating a state of the form A of a fifth variation of the thermoelectric conversion module according to the first embodiment of the disclosure.

As illustrated in FIG. 12, a thermoelectric conversion module 150 according to the fifth variation of the first embodiment includes a sheet-form substrate 10 formed in a rectangular shape and element main bodies 20 that are formed on the substrate 10 and that generate power based on temperature differences.

The substrate 10 is a sheet-form member having a rectangular shape in a plan view illustrated in FIG. 12. In the substrate 10, element main bodies 20 each of which includes three element bodies arranged in a direction toward the positive side in the X-axis direction and toward the positive side in the Y-axis direction are provided. The element main bodies 20 are arranged at approximately equal intervals in the X-axis direction. Outside longitudinal ends of the respective element bodies in the element main bodies 20, first incisions 14 extending in an alignment direction of the element bodies are provided. The first incisions 14 are disposed at an inclination with respect to the Y-axis direction at approximate center positions in the Y-axis direction of the substrate 10, and terminate within an area inside both ends of the substrate in the Y-axis direction.

The substrate 10 also has second incisions 13 that extends to both the ends of the substrate 10 in the Y-axis direction, excluding areas of the element main bodies 20. The first incisions 12 and the second incisions 13 are incisions penetrating in the thickness direction of the substrate 10.

The thermoelectric conversion module 150 in FIG. 12 illustrates an initial state (form A) in sheet form. When the thermoelectric conversion module 150 of this form A is stretched in the left and right directions in FIG. 12 and both longitudinal ends of the thermoelectric conversion module 150 are attached to not-illustrated attachment portions, which are stretchers, as illustrated in FIG. 13, mutually opposite edges 14*a* and 14*b* of the first incisions 14 and mutually opposite edges 13*a* and 13*b* of the second incisions 13 are separated from each other in the left and right directions in FIGS. 12 and 13, which are predetermined stretch directions. This causes the left edges 14*a* and 13*a* in FIG. 13 to distort and deform upwardly and the right edges 14*b* and 13*b* in FIG. 13 to distort and deform downwardly. This distorted deformation of the edges of the first incisions 14 and the second incisions 13 causes, in the example of FIG. 13, right ends of the element main bodies 20 to protrude upward (front side) in the sheet thickness direction. Also, left ends of the element main bodies 20 protrude downward (back side) in the sheet thickness direction (see FIG. 13).

Figure 13:
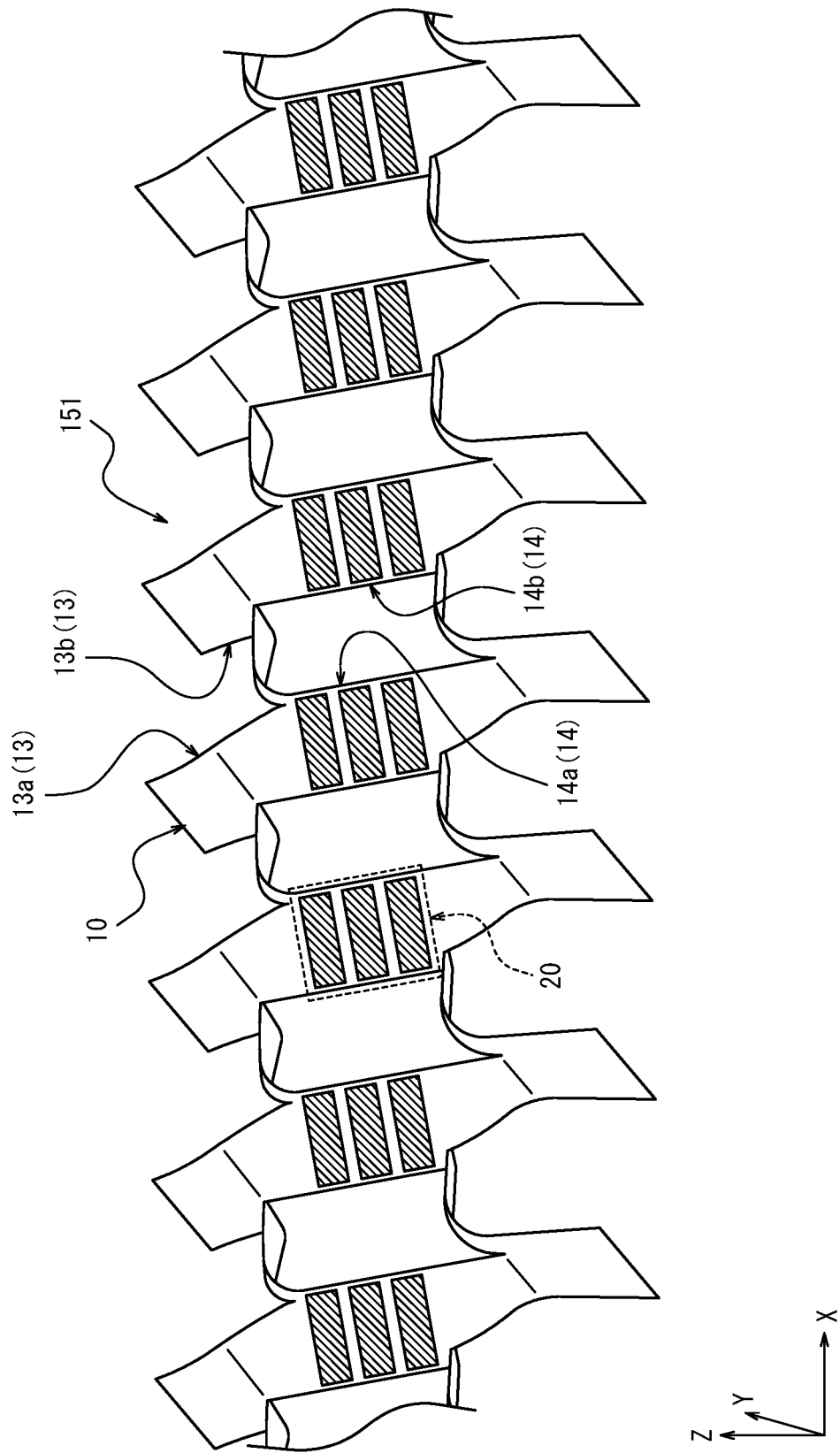
FIG. 13 is a perspective view illustrating a state of the form B of the fifth variation of the thermoelectric conversion module according to the first embodiment of the disclosure.

In the present embodiment, by stretching the thermoelectric conversion module 150 from a state of the form A to the left and right directions of FIG. 12, which are predetermined directions, the thermoelectric conversion module 150 protrudes in the sheet thickness direction and becomes a three-dimensional structural form (form B) as illustrated in FIG. 13. Thereby, a longitudinal right end of each element body, which constitutes the element main body 20, protrudes upward, and a longitudinal left end of each element body protrudes downward. Therefore, by disposing the thermoelectric conversion module 150 illustrated in FIG. 13 above a heat source, a temperature difference can be created in the longitudinal direction of each element body, which constitutes the element main body 20. Thus, the thermoelectric conversion characteristics can be enhanced.

Sixth and Seventh Variations of First Embodiment

Next, sixth and seventh variations of the thermoelectric conversion module according to the first embodiment of the present disclosure will be described using FIGS. 14 and 15.

Figure 14:
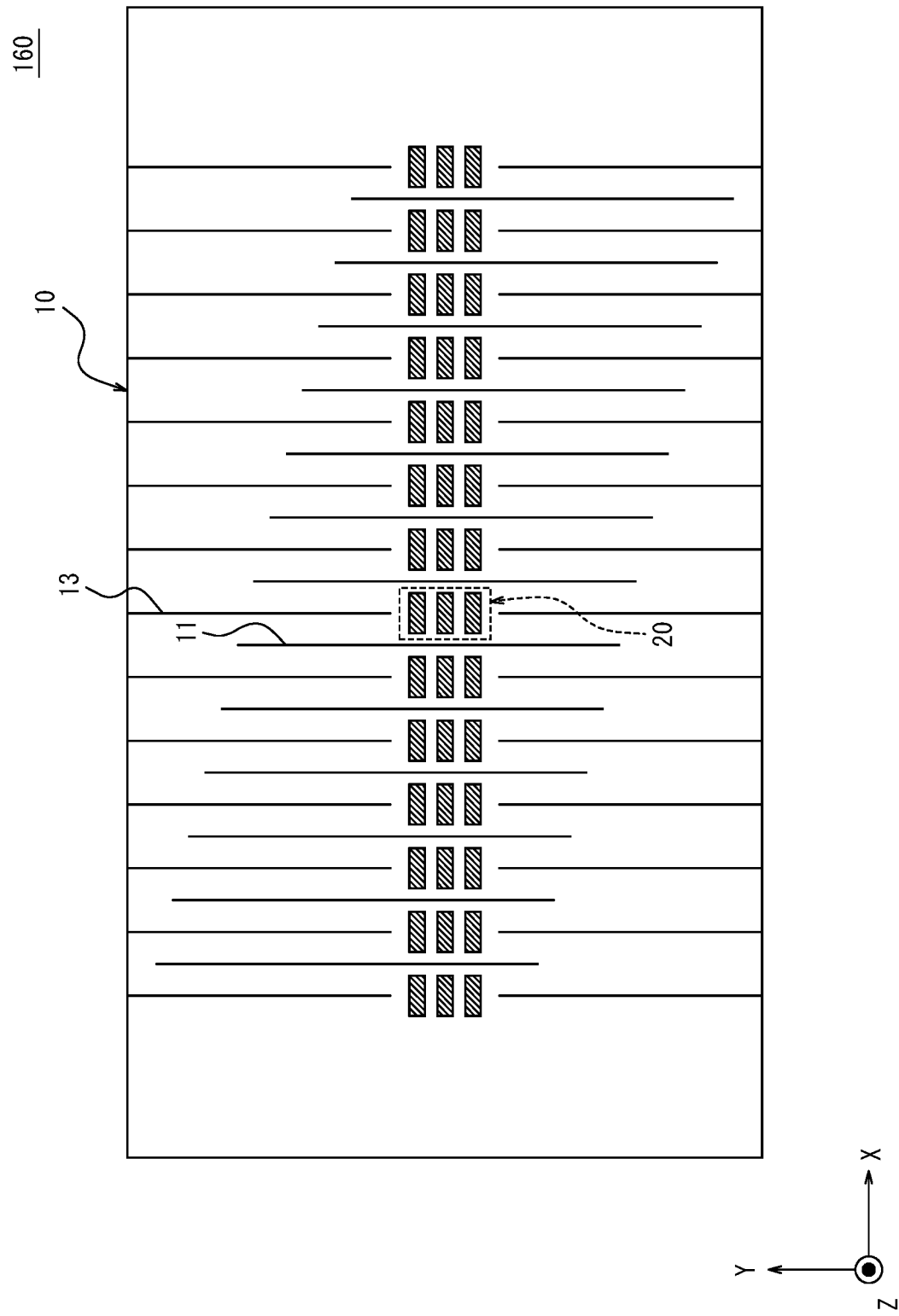
FIG. 14 is a plan view illustrating a state of the form A of a sixth variation of the thermoelectric conversion module according to the first embodiment of the disclosure.
Figure 15:
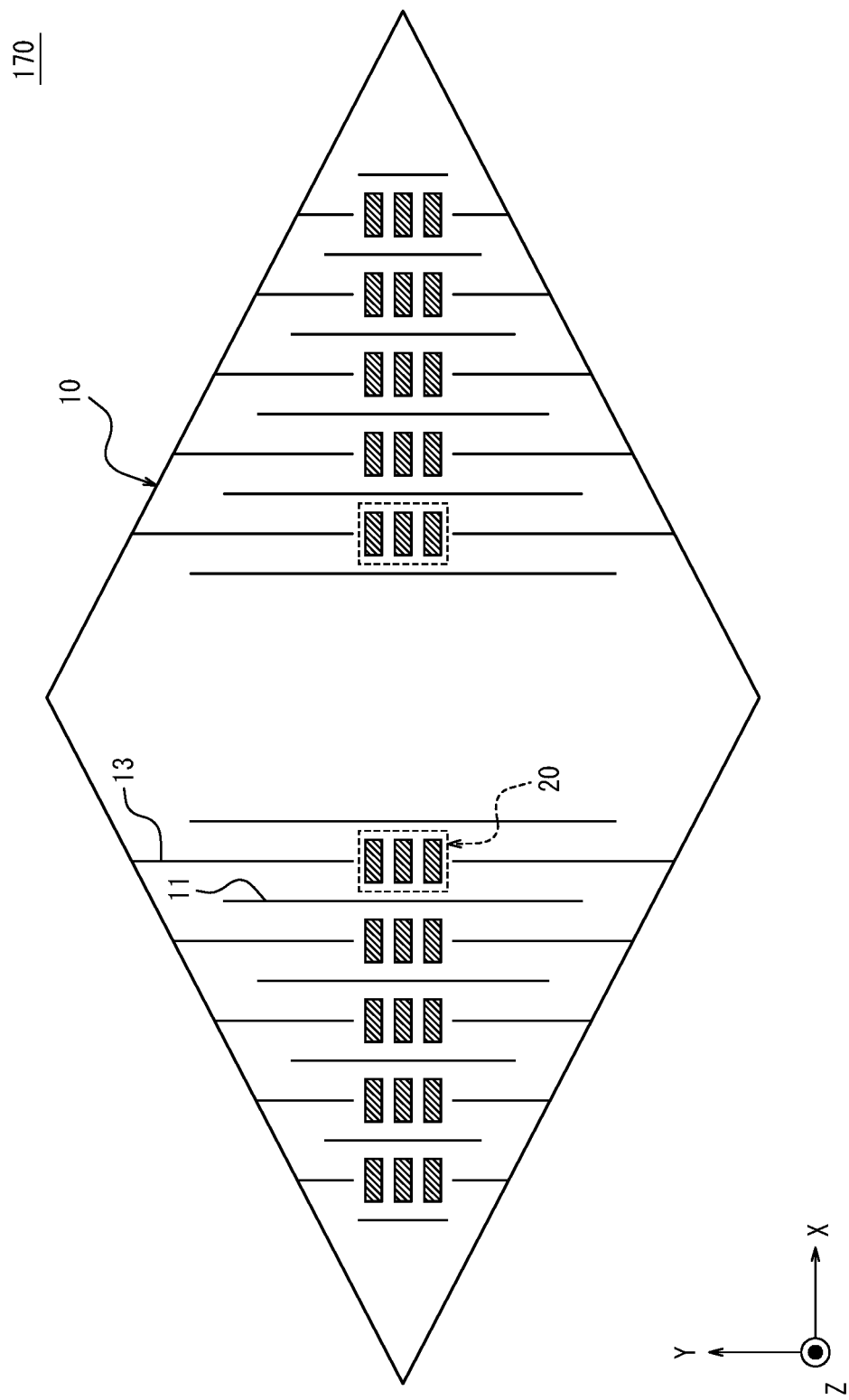
FIG. 15 is a plan view illustrating a state of the form A of a seventh variation of the thermoelectric conversion module according to the first embodiment of the disclosure.

As illustrated in FIGS. 14 and 15, a thermoelectric conversion module 160 according to the sixth variation of the first embodiment and a thermoelectric conversion module 170 according to the seventh variation each have a sheet-form substrate 10 and element main bodies 20 that are formed on the substrate 10 and that generate power based on temperature differences.

The thermoelectric conversion module 160 according to the sixth variation, compared to the first embodiment, approximates the first embodiment, except that a plurality of first incisions 11, which is oriented in the Y-axis direction and arranged at equal intervals in the X-axis direction, is gradually offset in the negative direction in the Y-axis direction, toward the positive side in the X-axis direction. The seventh variation illustrated in FIG. also approximates the configuration of the first embodiment, except that the outer shape of the substrate 10 is rhombic and no element main bodies 20 and no incisions are provided at the center in the X-axis direction, as compared to the first embodiment. Therefore, a detailed description here is omitted.

As described above, the present embodiment is the thermoelectric conversion module 100 formed in sheet form, the thermoelectric conversion module 100 being disposed in contact or proximity to the heat source and generating power based on the temperature differences between the portions close to the heat source and the portions away from the heat source, the thermoelectric conversion module 100 including the incisions penetrating in the sheet thickness direction, wherein by stretching the thermoelectric conversion module 100 in the predetermined direction, the mutually opposite edges of the incisions are separated, and the thermoelectric conversion module 100 is transformed from the sheet form A into the three-dimensional structural form B protruding in the sheet thickness direction. By adopting such a configuration, the thermoelectric conversion module 100 in sheet form can be transformed into the three-dimensional structural form and brought close to the heat source by the simple method of stretching the thermoelectric conversion module 100 in the predetermined direction, thereby increasing the temperature differences within the thermoelectric conversion module in sheet form and improving the thermoelectric conversion characteristics.

The present embodiment includes the sheet-form substrate 10, and the element main bodies 20 formed on the substrate 10. By adopting such a configuration, only a portion of the thermoelectric conversion module 100 that protrudes in the sheet thickness direction can be formed with a thermoelectric conversion element, so the thermoelectric conversion characteristics can be improved using less thermoelectric conversion material.

In the present embodiment, each element main body 20 preferably includes element bodies 21 to 23 formed in a strip shape, and the element bodies 21 to 23 are preferably disposed so that, in a state of the form B, both longitudinal ends of each element body are away from each other in a sheet protrusion direction. By adopting such a configuration, the temperature difference of each element body in the longitudinal direction can be efficiently created by bringing a back surface of the sheet closer to the heat source, thereby improving the thermoelectric conversion characteristics.

In the present embodiment, each element main body 20 includes a plurality of element bodies 21 to 23 formed in a strip shape, and the plurality of element bodies 21 to 23 adjacent to each other is preferably electrically connected in series at longitudinal ends. By adopting such a configuration, thermoelectromotive force generated in the element bodies can be increased by series connection and output.

In the present embodiment, the element bodies 21 to 23 are configured to contain carbon nanotubes. By adopting such a configuration, the thermoelectric conversion module 100 can obtain the effect of increasing the Seebeck coefficient itself of the element bodies 21 to 23 by stretching the thermoelectric conversion module 100, thereby improving the thermoelectric conversion characteristics. In addition, the mechanical strength of the thermoelectric conversion module 100 can be further improved and its weight can be reduced.

In the present embodiment, the length of each of the element bodies 21 to 23 in the longitudinal direction is configured to be 30 mm or more. By adopting such a configuration, the temperature differences within the element bodies 21 to 23 can be easily ensured, thus improving the thermoelectric conversion characteristics.

In the present embodiment, the length of each of the element bodies 21 to 23 in the longitudinal direction is configured to be 5 mm or more and 12 mm or less. By adopting such a configuration, electromotive force generated by the thermoelectric conversion module 100 can be increased for the same amount of carbon nanotubes used.

In the present embodiment, the heat conductivity of the substrate is configured to be 5.0 [W/(m·K)] or less. By adopting such a configuration, the heat conduction of the element bodies 21 to 23 in the longitudinal direction can be suppressed, making it easier to ensure the temperature differences and improving the thermoelectric conversion characteristics.

In the present embodiment, the thermoelectric conversion module 100 preferably includes, in a state of the form B, the element main bodies 20 as power generation portions, heat absorption portions in contact or proximity to the heat source 30, and heat dissipation portions in contact or proximity to a heat radiator with a lower temperature than the heat source 30, the heat dissipation portions being disposed on the opposite side to the heat absorption portions in the sheet protrusion direction. By adopting such a configuration, the temperature differences of the element bodies 21 to 23 in the longitudinal direction can be increased, thus improving the thermoelectric conversion characteristics.

The present embodiment is configured to have the plurality of incisions. By adopting such a configuration, the temperature differences of the plurality of element main bodies 20 can be easily ensured, thus improving the thermoelectric conversion characteristics.

In the present embodiment, the predetermined direction is configured to be a direction approximately orthogonal to an extension direction of the incisions in the in-plane direction of the thermoelectric conversion module 100 in a state of the form A. By adopting such a configuration, stretching the thermoelectric conversion module 100 in the predetermined direction increases distortion around the incisions and makes the thermoelectric conversion module 100 protrude in the sheet thickness direction, thus effectively creating the temperature differences within the element main bodies 20.

In the present embodiment, the incisions have first incision 11 that are disposed at approximately center positions in a direction orthogonal to the predetermined direction in areas between the plurality of the element main bodies 20 arranged in the predetermined direction, and second incision 13 that extend from both sides of the element main bodies 20 in the direction orthogonal to the predetermined direction to both ends of the thermoelectric conversion module 100, and the first and second incisions 11 and 13 are configured to be provided alternately in the predetermined direction. By adopting such a configuration, the separation of the edges 11a and 11b of the first incisions 11 makes it easier to displace ends of the element main bodies in the predetermined direction to a direction perpendicular to a sheet thickness, and the separation of the edges 13a and 13b of the second incisions 13 further reduces rigidity in the direction of erecting the element main bodies 20.

Second Embodiment

Figure 16:
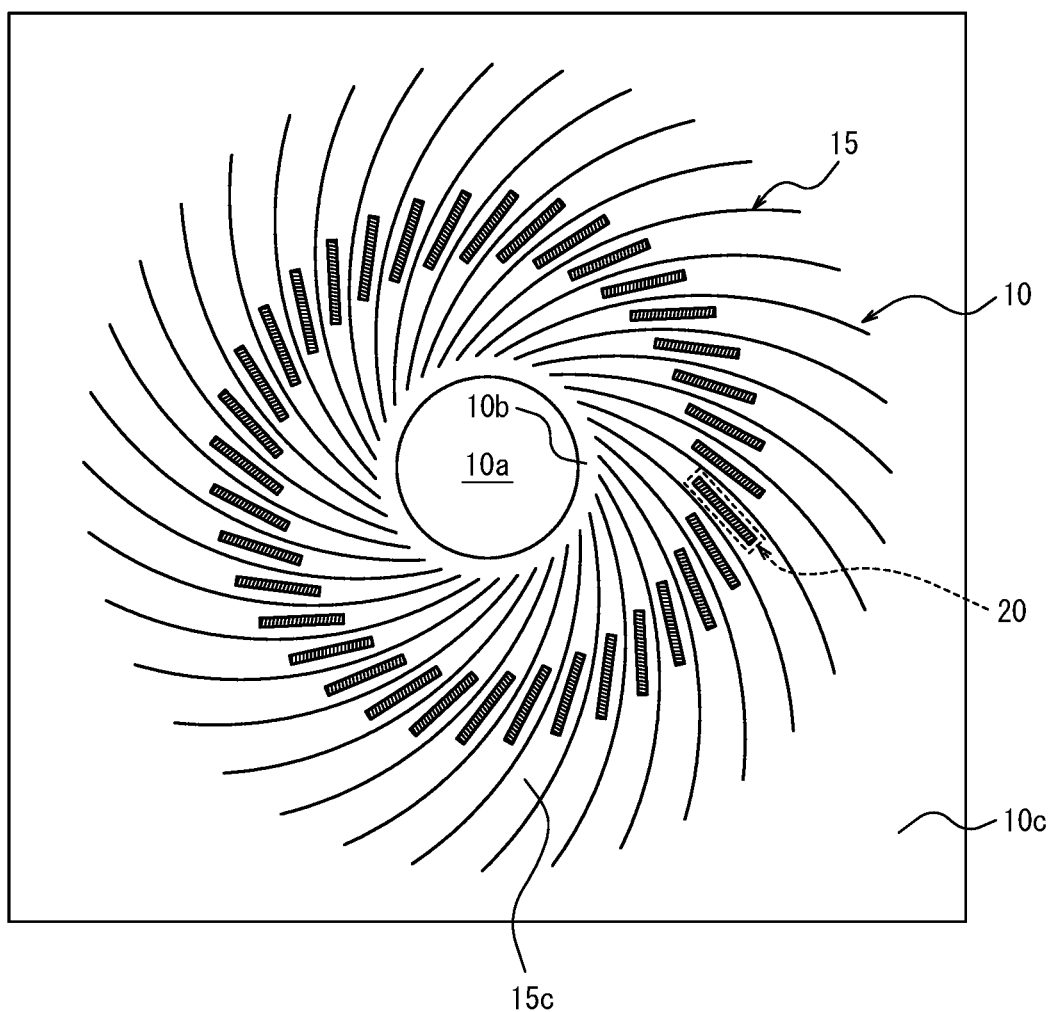
FIG. 16 is a plan view illustrating a state of the form A of a thermoelectric conversion module according to a second embodiment of the disclosure.
Figure 17:
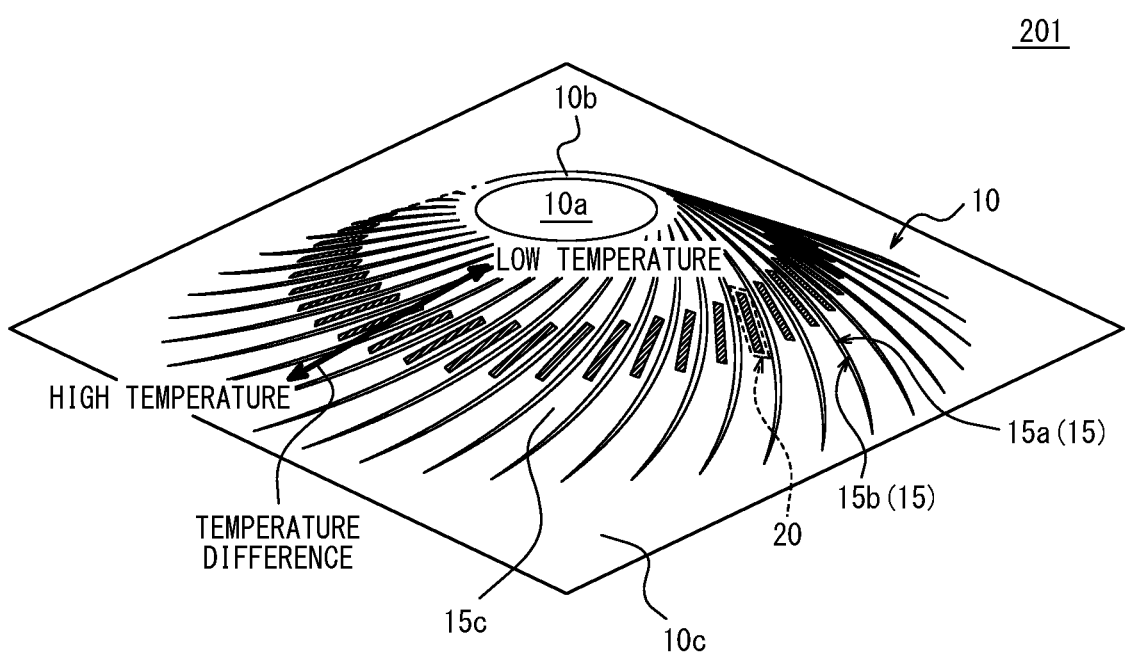
FIG. 17 is a perspective view illustrating a state of the form B of the thermoelectric conversion module according to the second embodiment of the disclosure.

FIGS. 16 and 17 illustrate the configuration of a thermoelectric conversion module 200, 201 according to a second embodiment of the present disclosure. As illustrated in FIG. 16, the thermoelectric conversion module 200 includes a substrate 10 formed in sheet form and element main bodies 20 that are formed on the substrate 10 and that generate power based on temperature differences within the thermoelectric conversion module 200.

The substrate 10 has a square shape in plan view as illustrated in FIG. 16. In the present embodiment, the substrate 10 has incisions 15 extending spirally from an annular inner circumferential portion 10b having an aperture 10a to an outer circumferential portion 10c provided concentrically with the inner circumferential portion 10b. The plurality of incisions 15 is formed at approximately equal intervals in a circumferential direction. In areas between the incisions 15 adjacent in the circumferential direction, as illustrated in FIG. 16, the element main bodies 20, which perform thermoelectric conversion, are disposed.

The thermoelectric conversion module 200 in FIG. 16 illustrates an initial state (form A) in sheet form. When the inner circumferential portion 10b of the thermoelectric conversion module 200 in the form A is stretched in a sheet thickness direction in FIG. 16 and attached to a not-illustrated attachment portion, which is a stretcher, the inner circumferential portion 10b rotates clockwise in plan view, and as illustrated in FIG. 17, mutually opposite edges 15a and 15b of the incisions 15 are separated in an approximately horizontal direction. Ends of the element main bodies 20 on an inner circumferential side are then displaced upward (to the front side) in the sheet thickness direction (see FIG. 17).

In the present embodiment, by stretching the thermoelectric conversion module 200 from a state of the form A to a predetermined direction, i.e., to a perpendicular direction to the paper surface in FIG. 16, the thermoelectric conversion module 200 protrudes in the sheet thickness direction and becomes a three-dimensional structural form (form B), as illustrated in FIG. 17. The form B is also identified by a different reference sign, such as "thermoelectric conversion module 201".

In the present embodiment, the thermoelectric conversion module 201 in a state of the form B can be disposed on a not-illustrated heat source. Thereby, outer circumferential sides of element bodies, which constitute the element main bodies 20, in the longitudinal direction become heat absorption portions that are disposed in proximity to a heat source 30. Inner circumferential sides of the element bodies in the longitudinal direction, which are opposite to the heat source, function as heat dissipation portions that are cooled by natural convection of air.

When p-type thermoelectric conversion elements are used for the element bodies constituting the element main bodies 20, as in the configuration in FIG. 3A, by connecting in series an end of each of the element bodies on a high-temperature side (a radial outer end in the example illustrated in FIG. 17) to an end of one of element bodies adjacent in the circumferential direction on a low-temperature side (a radial inner end in the example illustrated in FIG. 17) by wiring, and by connecting in series an end on the low-temperature side to an end of the other of the element bodies adjacent in the circumferential direction on the high-temperature side by wiring, the element main bodies 20 can obtain large thermoelectromotive force corresponding to the number of element bodies connected.

In the present embodiment, the element body, which is the single p-type thermoelectric conversion element, is configured to be disposed on an upper surface (front surface) of each helical arm 15c that is partitioned and formed by the incisions 15, but is not limited to this. Instead of the p-type thermoelectric conversion element, an n-type thermoelectric conversion element may be disposed. The entire single helical arm 15c may be formed of a thermoelectric conversion element. One p-type thermoelectric conversion element and one n-type thermoelectric conversion element may be disposed on the front and back sides of each helical arm 15c, respectively, and an end of each element body that is the p-type thermoelectric conversion element on the high-temperature side may be connected in series by wiring to an end of an element body that is the n-type thermoelectric conversion element on the opposite side of the helical arm 15c on the high-temperature side, and an end of each element body that is the p-type thermoelectric conversion element on the low-temperature side may be connected in series by wiring to an end of an adjacent element body that is the n-type thermoelectric conversion element on the low-temperature side.

As described above, in the present embodiment, the predetermined direction is configured to be a direction approximately orthogonal to the in-plane direction of the sheet-form thermoelectric conversion module 200 in the form A. By adopting such a configuration, the direction in which the stretcher pulls the thermoelectric conversion module 200 coincides with the direction in which the thermoelectric conversion module 200 is stretched, so the thermoelectric conversion module 200 can be reliably stretched by an amount necessary for desired power generation.

In the present embodiment, the incisions 15 are configured to extend spirally from the inner circumferential portion 10b to the outer circumferential portion 10c provided concentrically with the inner circumferential portion 10b, in the thermoelectric conversion module 200 in a state of the form A, and in a state of the form B, the inner circumferential portion 10b is configured to protrude in the thickness direction of the thermoelectric conversion module 200, and at least one of the inner circumferential portion 10b or the outer circumferential portion 10c is configured to be disposed in contact or proximity to the heat source. By adopting such a configuration, the thermoelectric conversion module 200 has an axisymmetric structure, and each element body can perform stable power generation corresponding to the amount of protrusion of the inner circumferential portion 10b.

Third Embodiment

Figure 18:
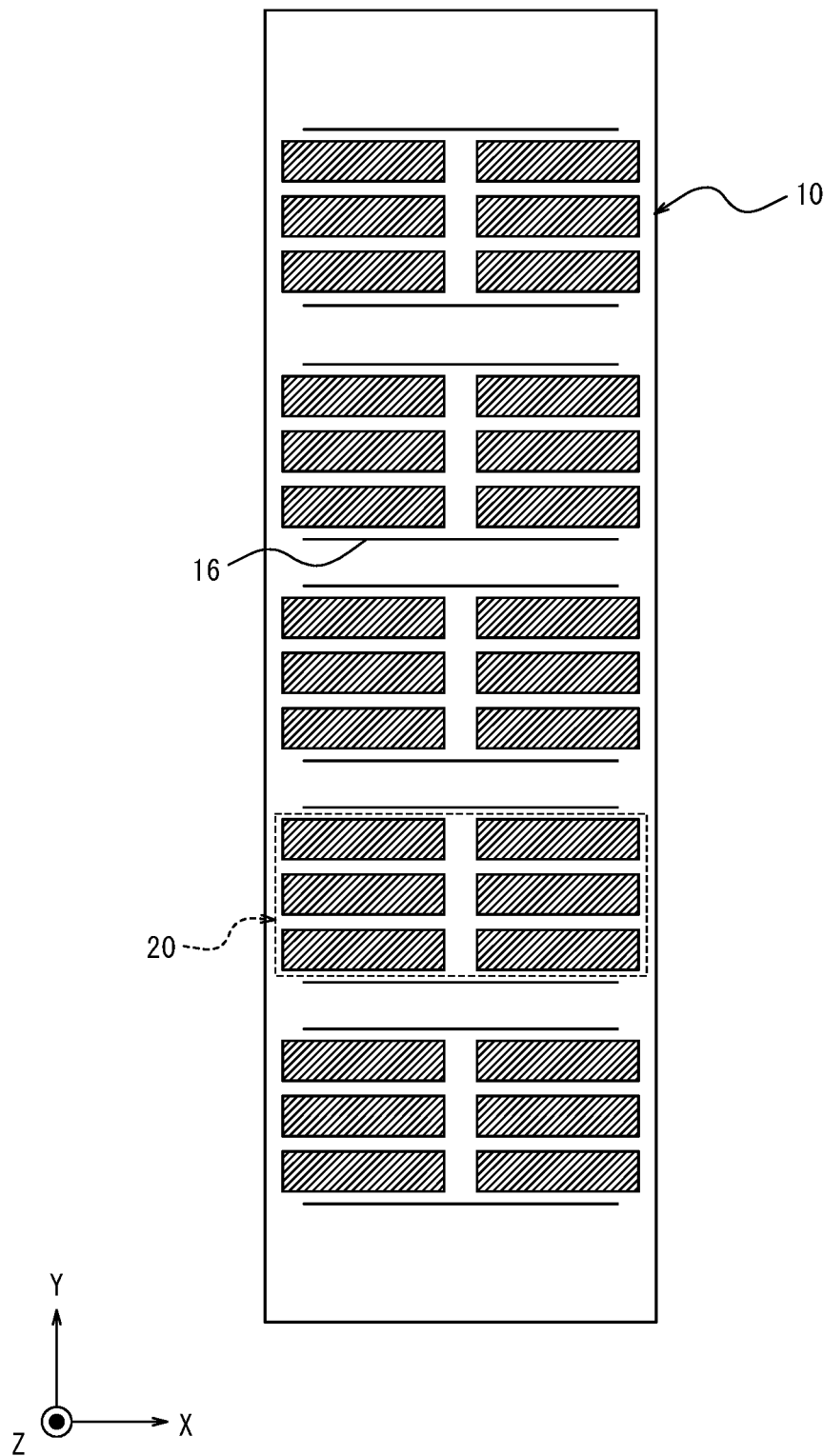
FIG. 18 is a plan view illustrating a state of the form A of a thermoelectric conversion module according to a third embodiment of the disclosure.
Figure 19:
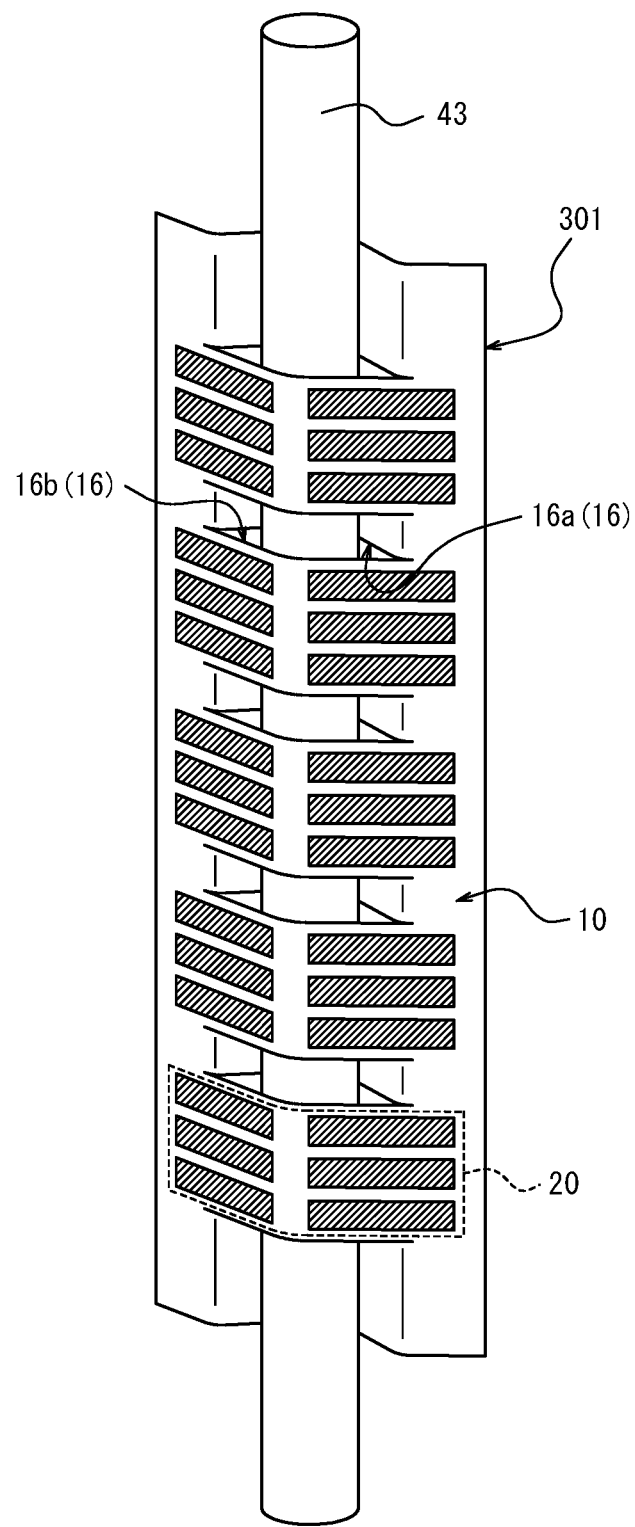
FIG. 19 is a perspective view illustrating a state of the form B of the thermoelectric conversion module according to the third embodiment of the disclosure.

FIGS. 18 and 19 illustrate the configuration of a thermoelectric conversion module 300, 301 according to a third embodiment of the present disclosure. As illustrated in FIG. 18, the thermoelectric conversion module 300 has a substrate 10 formed in sheet form and element main bodies 20 that are formed on the substrate 10 and that generate power based on temperature differences within the thermoelectric conversion module 300.

The substrate 10 has a rectangular shape long in the Y-axis direction in plan view as illustrated in FIG. 18. In the present embodiment, in the substrate 10, element main bodies 20 each of which is constituted of a total of six element bodies for thermoelectric conversion, two aligned in the X-axis direction and three aligned in the Y-axis direction, are formed. In the present embodiment, four of the element main bodies 20 are aligned at predetermined intervals in the Y-axis direction as illustrated in FIG. 18, and incisions 16, which extend in the X-axis direction and terminate inside both ends of the substrate 10 in the X-axis direction, are provided on both sides of each element main body 20 in the Y-axis direction. Thus, two parallel incisions 16 are provided between the element main bodies 20, as illustrated in FIG. 18. In the present embodiment, the incisions 16 extend approximately in the same direction (X-axis direction) in an in-plane direction of the thermoelectric conversion module 300 and are disposed apart in the Y-axis direction.

The thermoelectric conversion module 300 in FIG. 18 illustrates an initial state (form A) in sheet form. To the thermoelectric conversion module 300 of this form A, a bar-shaped member 43, which is a stretcher, is attached so as to alternately penetrate incisions 16 from a front surface (the surface on which the element main bodies 20 are disposed in FIG. 18) to a back surface and from the back surface to the front surface, as illustrated in FIG. 19. Thereby, as illustrated in FIG. 19, opposite edges 16a and 16b of the incisions 16 are separated in a sheet thickness direction, and the thermoelectric conversion module 300 in the form A is transformed into a three-dimensional structural form (form B) in which center positions of the element main bodies 20 in the X-axis direction protrude upward (to a front side) in the sheet thickness direction. Among areas between the incisions 16, areas with the element main bodies 20 protrude to a front side of the thermoelectric conversion module 300, and areas between the element main bodies 20 in the Y-axis direction protrude to a back side of the thermoelectric conversion module 300.

In the present embodiment, the thermoelectric conversion module 301 in a state of the form B can be disposed on a not-illustrated heat source so that the back surface of the thermoelectric conversion module 301 is in proximity to the heat source. Thereby, longitudinal outer sides of the element bodies, which constitute the element main bodies 20, become heat absorption portions that are positioned in proximity to a heat source 30. Longitudinal inner sides of the element bodies, which are opposite to the heat source, function as heat dissipation portions that are cooled by natural convection of air.

When p-type thermoelectric conversion elements are used for the element bodies constituting the element main bodies 20, as in the configuration in FIG. 3A, by connecting in series an end of each of the element bodies on a high-temperature side (an outer end in the example illustrated in FIG. 19) to an end of an adjacent element body on a low-temperature side (an inner end in the example illustrated in FIG. 19) by wiring, and by connecting in series an end on the low-temperature side to an end of an adjacent element body on the high-temperature side by wiring, the element main bodies 20 can obtain large thermoelectromotive force corresponding to the number of element bodies connected.

For example, when p-type and n-type thermoelectric conversion elements are used for the element bodies constituting the element main bodies 20, as in the configuration in FIG. 3B, by connecting in series an end of each of the p-type thermoelectric conversion elements on the high-temperature side to an end of an adjacent n-type thermoelectric conversion element on the high-temperature side or to an end of an adjacent p-type thermoelectric conversion element on the low-temperature side by wiring, and by connecting in series an end on the low-temperature side to an end of an adjacent n-type thermoelectric conversion element on the low-temperature side or to an end of an adjacent p-type thermoelectric conversion element on the high-temperature side by wiring, the element main bodies 20 can obtain large thermoelectromotive force corresponding to the number of element bodies connected. Also, as in the configuration in FIG. 3C, by connecting in series an end of each of the p-type thermoelectric conversion elements on the high-temperature side to an end of an adjacent n-type thermoelectric conversion element on the high-temperature side by wiring, and by connecting in series an end on the low-temperature side to an end of an adjacent n-type thermoelectric conversion element on the low-temperature side by wiring, the element main bodies 20 can obtain large thermoelectromotive force corresponding to the number of element bodies connected.

First Variation of Third Embodiment

Next, a first variation of the thermoelectric conversion module according to the third embodiment of the present disclosure will be described using FIGS. 20 and 21.

Figure 20:
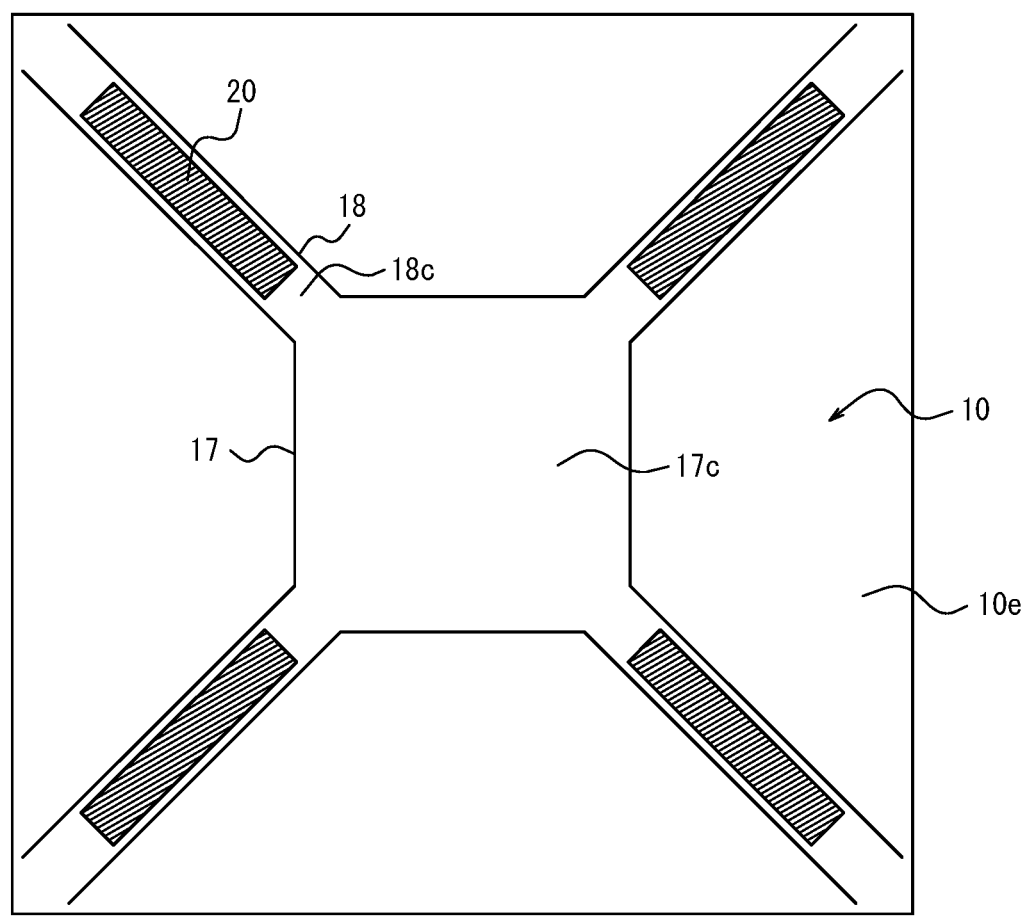
FIG. 20 is a plan view illustrating a state of the form A of a first variation of the thermoelectric conversion module according to the third embodiment of the disclosure.
Figure 21:
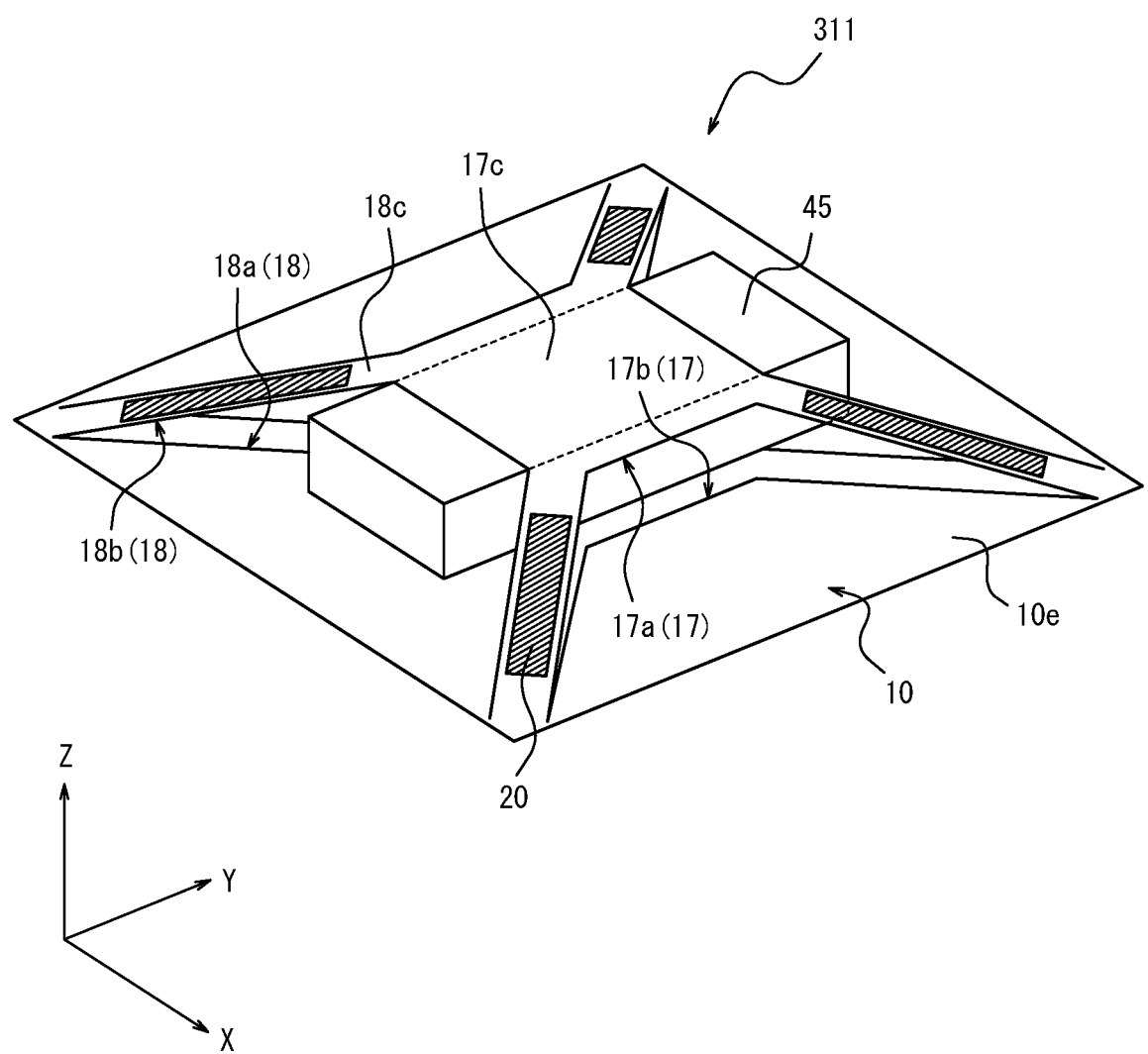
FIG. 21 is a perspective view illustrating a state of the form B of the first variation of the thermoelectric conversion module according to the third embodiment of the disclosure.

As illustrated in FIG. 20, a thermoelectric conversion module 310 has a substrate 10 formed in sheet form and element main bodies 20 that are formed on the substrate 10 and that generate power based on temperature differences within the thermoelectric conversion module 310.

The substrate 10 has an approximately square shape in plan view as illustrated in FIG. 20. In the present embodiment, the substrate 10 has central incisions 17 for partitioning and forming the central portion 17c of the substrate 10 into an approximately square shape, and arm incisions 18 for partitioning and forming arm portions 18c that extends radially from the central portion 17c to corners of the substrate 10. The arm portions 18c are partitioned and formed with respect to an outer peripheral portion 10e by the arm incisions 18. On each of the four arm portions 18c extending from the central portion 17c toward the corners of the substrate 10, an element main body 20 extending in a longitudinal direction of the arm portion 18c is disposed.

The thermoelectric conversion module 310 in FIG. 20 illustrates an initial state (form A) in sheet form. For the thermoelectric conversion module 310 of this form A, as illustrated in FIG. 21, a rectangular member 45 in a rectangular parallelepiped shape, which is a stretcher, is disposed between a back surface of the central portion 17c and a front surface of the outer peripheral portion 10e with the central portion 17c lifted upward, so that opposite edges 17a and 17b of the central incisions 17 are separated in a sheet thickness direction and opposite edges 18a and 18b of the arm incisions 18 are separated in the sheet thickness direction. Thereby, the thermoelectric conversion module 310 in the form A is transformed into a three-dimensional structural form (form B) in which the central portion 17c protrudes upward.

In the present embodiment, the thermoelectric conversion module 311 in a state of the form B can be disposed on a not-illustrated heat source, for example, so that the back surface of the thermoelectric conversion module 311 is in proximity to the heat source. Thereby, longitudinal outer sides of element bodies, which constitute the element main bodies 20, become heat absorption portions that are positioned in proximity to a heat source 30. Longitudinal inner sides of the element bodies, which are opposite to the heat source, function as heat dissipation portions that are cooled by natural convection of air.

When p-type thermoelectric conversion elements are used for the element bodies constituting the element main bodies 20, as in the configuration in FIG. 3A, by connecting in series an end of each of the element bodies on a high-temperature side (an outer end in the example illustrated in FIG. 21) to an end of another element body on a low-temperature side (an inner end in the example illustrated in FIG. 21) by wiring, and by connecting in series an end on the low-temperature side to an end of another element body on the high-temperature side by wiring, the element main bodies 20 can obtain large thermoelectromotive force corresponding to the number of element bodies connected.

For example, when p-type and n-type thermoelectric conversion elements are used for the element bodies constituting the element main bodies 20, as in the configuration in FIG. 3B, by connecting in series an end of each of the p-type thermoelectric conversion elements on the high-temperature side to an end of another n-type thermoelectric conversion element on the high-temperature side or to an end of another p-type thermoelectric conversion element on the low-temperature side by wiring, and by connecting in series an end on the low-temperature side to an end of another n-type thermoelectric conversion element on the low-temperature side or to an end of another p-type thermoelectric conversion element on the high-temperature side by wiring, the element main bodies 20 can obtain large thermoelectromotive force corresponding to the number of element bodies connected. Also, as in the configuration in FIG. 3C, by connecting in series an end of each of the p-type thermoelectric conversion elements on the high-temperature side to an end of another n-type thermoelectric conversion element on the high-temperature side by wiring, and by connecting in series an end on the low-temperature side to an end of another n-type thermoelectric conversion element on the low-temperature side by wiring, the element main bodies 20 can obtain large thermoelectromotive force corresponding to the number of element bodies connected.

As described above, in the present embodiment, the plurality of the incisions 16 extending approximately in the same direction in the in-plane direction of the thermoelectric conversion module 300 in a state of the form A is disposed separately in the direction approximately orthogonal to the extension direction of the incisions, and by the stretcher alternately penetrating the plurality of the incisions 16 from the front surface of the thermoelectric conversion module 300 to the back surface and from the back surface to the front surface, the thermoelectric conversion module 300 is configured to be transformed into a state of the form B in which areas between adjacent incisions 16 protrude to the front side of the thermoelectric conversion module and the back side alternately. By adopting such a configuration, the temperature differences can be reliably created in the element main bodies 20 by making a portion of the substrate 10 protrude stably in the sheet thickness direction, as the rod-shaped member alternately penetrates the incisions 16 from the front surface of the thermoelectric conversion module 300 to the back surface and from the back surface to the front surface. Therefore, the thermoelectric conversion characteristics can be improved.

In the present embodiment, the central portion 17c that is provided at the approximately center position of the thermoelectric conversion module 310 in a state of the form A in the in-plane direction and that is partitioned and formed by the central incisions 17 with respect to outer peripheral portion 10e is preferably connected to the outer peripheral portion 10e through arm portions 18c that are partitioned and formed by the arm incisions 18 with respect to the outer peripheral portion 10e, and by disposing the stretcher between the back surface of the central portion 17c and the front surface of the outer peripheral portion 10e, the thermoelectric conversion module 310 is configured to be transformed into a state of the form B in which the central portion 17c protrudes to the front side of the thermoelectric conversion module 310. By adopting such a configuration, the temperature differences can be reliably created in the element main bodies 20 by making a portion of the substrate 10 protrude stably in the sheet thickness direction. Therefore, the thermoelectric conversion characteristics can be improved.

Although the present disclosure has been described based on the drawings and examples, it should be noted that one skilled in the art can easily make various variations and modifications based on the present disclosure. Accordingly, it should be noted that these variations and modifications are included in the scope of the invention. For example, the functions included in each component can be rearranged in a logically consistent manner, and multiple components can be combined into one or divided. It should be understood that these are also included in the scope of the invention.

For example, the first to third embodiments are each configured with the substrate 10 and element main bodies 20 formed on the substrate 10, but are not limited to this. The entire thermoelectric conversion module may be formed of the thermoelectric conversion elements without the substrate 10.

In the first to third embodiments, the thermoelectric conversion module is configured to be stretched in the predetermined direction by the end of the thermoelectric conversion module in the stretch direction being attached to the attachment portion, but is not limited to this. For example, the thermoelectric conversion module may be stretched in the predetermined direction by a user wearing clothing or the like to which the thermoelectric conversion module is sewn, or by a user pulling and stretching the thermoelectric conversion module in the predetermined direction by hand. The stretcher of the disclosure includes the broad concept of being able to stretch the thermoelectric conversion module in the predetermined direction.

INDUSTRIAL APPLICABILITY

According to the disclosure, the sheet-form thermoelectric conversion module 100 with excellent thermoelectric conversion characteristics can be provided.

REFERENCE SIGNS LIST 10 substrate
10*a* aperture
10*b* inner circumferential portion
10*c* outer circumferential portion
10*e* outer peripheral portion
11 first incision
11*a*, 11*b* edge
12 first incision
12*a*, 12*b* edge
13 second incision
13*a*, 13*b* edge
14 first incision
14*a*, 14*b* edge
15 incision
15*a*, 15*b* edge
15*c* helical arm
16 incision
16*a*, 16*b* edge
17 central incision
17*a*, 17*b* edge
17*c* central portion
18 arm incision
18*a*, 18*b* edge
18*c* arm portion
20 element main body
21, 21A, 22, 22A, 23, 23A element body
25 wiring
30 heat source
40 attachment portion (stretcher)
41 heat source (stretcher)
43 bar-shaped member (stretcher)
45 rectangular member (stretcher)
100, 110, 120, 130, 140, 150, 160, 170, 200, 300, 310 thermoelectric conversion module (form A)
101, 111, 121, 151, 201, 301, 311 thermoelectric conversion module (form B)

The invention claimed is:

1. A thermoelectric conversion module formed in sheet form, the thermoelectric conversion module being disposed in contact or proximity to a heat source and generating power based on a temperature difference between a portion close to the heat source and a portion away from the heat source, the thermoelectric conversion module comprising:
an incision penetrating in a sheet thickness direction;
wherein by stretching the thermoelectric conversion module in a predetermined direction, mutually opposite edges of the incision are separated, and the thermoelectric conversion module is transformed from a sheet form A into a three-dimensional structural form B protruding in the sheet thickness direction.

2. The thermoelectric conversion module according to claim 1, comprising:
a sheet-form substrate; and
an element main body formed on the substrate.

3. The thermoelectric conversion module according to claim 2, wherein
the element main body includes an element body formed in a strip shape, and
the element body is disposed so that, in a state of the form B, both longitudinal ends of the element body are away from each other in a sheet protrusion direction.

4. The thermoelectric conversion module according to claim 2, wherein
the element main body includes a plurality of element bodies formed in a strip shape, and
the plurality of element bodies adjacent to each other is electrically connected in series at longitudinal ends.

5. The thermoelectric conversion module according to claim 3, wherein the element body contains carbon nanotubes.

6. The thermoelectric conversion module according to claim 5, wherein a length of the element body in a longitudinal direction is 30 mm or more.

7. The thermoelectric conversion module according to claim 5, wherein a length of the element body in a longitudinal direction is 5 mm or more and 12 mm or less.

8. The thermoelectric conversion module according to claim 2, wherein a heat conductivity of the substrate is 5.0 [W/(m·K)] or less.

9. The thermoelectric conversion module according to claim 2, wherein the thermoelectric conversion module comprises, in a state of the form B:
the element main body as a power generation portion;
a heat absorption portion in contact or proximity to the heat source; and
a heat dissipation portion in contact or proximity to a heat radiator with a lower temperature than the heat source, the heat dissipation portion being disposed on an opposite side to the heat absorption portion in a sheet protrusion direction.

10. The thermoelectric conversion module according to claim 1, comprising a plurality of the incisions.

11. The thermoelectric conversion module according to claim 1, wherein the predetermined direction is a direction substantially orthogonal to an extension direction of the incision in the thermoelectric conversion module in a state of the form A.

12. The thermoelectric conversion module according to claim 11, wherein the predetermined direction is a direction substantially orthogonal to the extension direction of the incision in an in-plane direction of the thermoelectric conversion module in the state of the form A.

13. The thermoelectric conversion module according to claim 12, comprising:
a sheet-form substrate; and
an element main body formed on the substrate, wherein
the incision has a first incision that is disposed at a substantially center position in a direction orthogonal to the predetermined direction in an area between a plurality of the element main bodies arranged in the predetermined direction, and a second incision that extends from both sides of the element main body in the direction orthogonal to the predetermined direction to both ends of the thermoelectric conversion module, and
the first and second incisions are provided alternately in the predetermined direction.

14. The thermoelectric conversion module according to claim 11, wherein the predetermined direction is a direction substantially orthogonal to an in-plane direction of the sheet-form thermoelectric conversion module in a state of the form A.

15. The thermoelectric conversion module according to claim 14, wherein
the incision extends spirally from an inner circumferential portion to an outer circumferential portion provided concentrically with the inner circumferential portion, in the thermoelectric conversion module in a state of the form A, and
in a state of the form B, the inner circumferential portion protrudes in a thickness direction of the thermoelectric conversion module, and at least one of the inner circumferential portion or the outer circumferential portion is disposed in contact or proximity to the heat source.

16. The thermoelectric conversion module according to claim 14, wherein
a plurality of the incisions extending substantially in a same direction in an in-plane direction of the thermoelectric conversion module in a state of the form A is disposed separately in a direction substantially orthogonal to an extension direction of the incisions, and
by a stretcher alternately penetrating the plurality of the incisions from a front surface of the thermoelectric conversion module to a back surface and from the back surface to the front surface, the thermoelectric conversion module is transformed into a state of the form B in which areas between adjacent incisions protrude to a front side of the thermoelectric conversion module and a back side alternately.

17. The thermoelectric conversion module according to claim 14, wherein
a central portion that is provided at a substantially center position of the thermoelectric conversion module in a state of the form A in an in-plane direction and that is partitioned and formed by the incision with respect to an outer peripheral portion is connected to the outer peripheral portion through an arm portion that is partitioned and formed by the incision with respect to the outer peripheral portion, and
by disposing a stretcher between a back surface of the central portion and a front surface of the outer peripheral portion, the thermoelectric conversion module is transformed into a state of the form B in which the central portion protrudes to a front side of the thermoelectric conversion module.

18. The thermoelectric conversion module according to claim 3, wherein a heat conductivity of the substrate is 5.0 [W/(m·K)] or less.

19. The thermoelectric conversion module according to claim 4, wherein a heat conductivity of the substrate is 5.0 [W/(m·K)] or less.

20. The thermoelectric conversion module according to claim 1, wherein the predetermined direction is a direction substantially orthogonal to an extension direction of the incision in the thermoelectric conversion module in a state of the form A.

* * * * *